US012751258B2

(12) United States Patent
Chung et al.

(10) Patent No.: US 12,751,258 B2
(45) Date of Patent: Sep. 29, 2026

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Chin-Lung Chung, Hsinchu (TW); Shin-Yi Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 386 days.

(21) Appl. No.: 18/381,374

(22) Filed: Oct. 18, 2023

(65) Prior Publication Data

US 2025/0132200 A1 Apr. 24, 2025

(51) Int. Cl.
*H01L 21/78* (2006.01)
*H10W 20/00* (2026.01)
(Continued)

(52) U.S. Cl.
CPC ....... *H10W 20/055* (2026.01); *H10W 20/034* (2026.01); *H10W 20/035* (2026.01);
(Continued)

(58) Field of Classification Search
CPC ......... H01L 21/76867; H01L 21/76804; H01L 21/76832; H01L 21/76834; H01L 21/76844; H01L 21/76846; H01L 21/7685; H01L 21/76883; H01L 23/5226; H01L 23/53219; H01L 23/53223; H01L 23/53233; H01L 23/53238; H01L 23/53247; H01L 23/53252; H01L 23/53261; H01L 23/53266; H01L 23/53295; H01L 2221/1063; H01L 21/76849
(Continued)

(56) References Cited

U.S. PATENT DOCUMENTS 6,130,161 A * 10/2000 Ashley .............. H01L 21/76846 257/E21.585
6,258,710 B1 * 7/2001 Rathore ............ H01L 21/76846 427/124
(Continued)

*Primary Examiner* — Vu A Vu
(74) *Attorney, Agent, or Firm* — Birch, Stewart, Kolasch & Birch, LLP

(57) ABSTRACT

A semiconductor structure and a manufacturing method thereof are provided. The manufacturing method includes the following steps. A trench is formed in a first interlayer dielectric (ILD) layer. A metal conductor with metal dopants is filled in the trench. Planarization is performed on the metal conductor with the metal dopants. A thermal treatment, a photo treatment or a bias-assist treatment is performed on the metal conductor with the metal dopants to form a self-forming metal capping layer on a first metal layer. An etching stop bi-layer structure is formed on the first interlayer dielectric layer and the self-forming metal capping layer. A via, a second interlayer dielectric (ILD) layer and a second metal layer are formed on the etching stop bi-layer structure. The via is embedded in the second interlayer dielectric layer and the via is disposed between the first metal layer and the second metal layer.

20 Claims, 42 Drawing Sheets

A-1

(51) Int. Cl.

| | |
|---|---|
| ***H10W 20/41*** | (2026.01) |
| ***H10W 20/42*** | (2026.01) |
| ***H10W 20/44*** | (2026.01) |
| ***H10W 20/47*** | (2026.01) |

(52) U.S. Cl.

CPC ....... *H10W 20/038* (2026.01); *H10W 20/056* (2026.01); *H10W 20/075* (2026.01); *H10W 20/077* (2026.01); *H10W 20/082* (2026.01); *H10W 20/42* (2026.01); *H10W 20/425* (2026.01); *H10W 20/4407* (2026.01); *H10W 20/4424* (2026.01); *H10W 20/4435* (2026.01); *H10W 20/4446* (2026.01); *H10W 20/47* (2026.01)

(58) Field of Classification Search

USPC .......................................................... 257/774

See application file for complete search history.

(56) References Cited

U.S. PATENT DOCUMENTS

| | | | | |
|---|---|---|---|---|
| 7,008,872 | B2 * | 3/2006 | Dubin | H01L 21/76807 257/E21.174 |
| 7,101,790 | B2 * | 9/2006 | Lee | H01L 21/76873 438/653 |
| 7,776,743 | B2 * | 8/2010 | Russell | H01L 21/02068 257/E21.586 |
| 9,406,555 | B2 * | 8/2016 | Deng | H01L 21/76883 |
| 9,859,153 | B1 * | 1/2018 | Rainville | C23C 16/45589 |
| 10,304,729 | B2 * | 5/2019 | Tsai | H01L 21/76804 |
| 11,145,751 | B2 * | 10/2021 | Chen | H10D 30/6219 |
| 12,394,716 | B2 * | 8/2025 | Naylor | H01L 23/53238 |
| 2021/0407852 | A1 * | 12/2021 | Yeh | H01L 21/76862 |
| 2022/0293512 | A1 * | 9/2022 | Lo | H01L 23/5222 |

* cited by examiner

SEMICONDUCTOR STRUCTURE AND MANUFACTURING METHOD THEREOF

BACKGROUND

The disclosure relates in general to a semiconductor structure for interconnection and a manufacturing method thereof, and more particularly to a semiconductor structure and a manufacturing method thereof.

As dimension shrinks, the current density through metal interconnects increases, which requires a higher electromigration lifetime. Regarding this requirement, a metal capping layer on the metal line is used to improve the electromigration as compared to conventional dielectric capping layer. However, during forming the metal capping layer using selective deposition process, some metallic residues may be formed on the interface between the interlayer dielectric layer and the etching stop layer. This may cause leakage between neighboring wires.

Further, a conformal etching stop layer is used to stop the etching. The conformal etching stop layer with higher dielectric constant as compared to the interlayer dielectric (ILD) layer, would cause higher capacitance and thus result in an increased interconnection RC delay.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
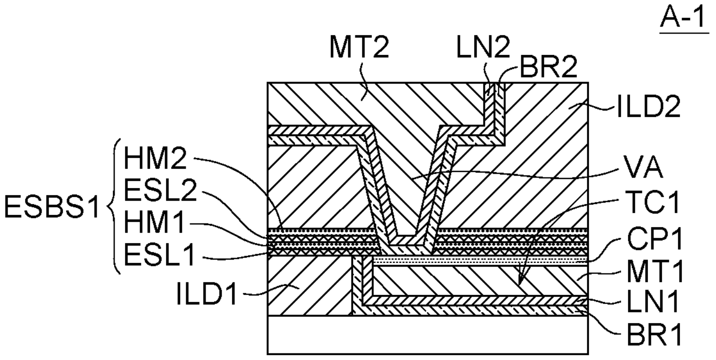
FIG. 1 shows a semiconductor structure A-1 according to one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please refer to FIG. 1, which shows a semiconductor structure A-1 according to one embodiment. The semiconductor structure A-1 is an interconnection for two metal layers MT1, MT2 with dual damascene in the back-end-of-line (BEOL) process. The semiconductor structure A-1 includes, for example, a interlayer dielectric (ILD) layer ILD1, a barrier layer BR1, a liner layer LN1, the metal layer MT1, a self-forming metal capping layer CP1, an etching stop bi-layer structure ESBS1, a interlayer dielectric layer ILD2, a barrier layer BR2, a liner layer LN2, a via VA and the metal layer MT2.

The metal layer MT1 is embedded in the interlayer dielectric layer ILD1. The material of the interlayer dielectric layer ILD1 is, for example, silicon oxide (SiO), silicon oxycarbide (SiCO), silicon carbon nitride (SiCN), silicon oxycarbonitride (SiCON), silicon oxynitride (SiNO), silicon nitride (SiN), the like or a combination thereof. The material of the metal layer MT1 is, for example, tungsten (W), ruthenium (Ru), cobalt (Co), copper (Cu), aluminum (Al), nickel (Ni), gold (Au), silver (Ag), gold-aluminum (AuAl), molybdenum (Mo), the like, or a combination thereof.

The barrier layer BR1 and the liner layer LN1 are disposed between the metal layer MT1 and the interlayer dielectric layer ILD1. The material of the barrier layer BR1 is, for example, titanium nitride (TiN), tantalum nitride (TaN) or silicon nitride (SiN), the like, or a combination thereof. The material of the liner layer LN1 is, for example, cobalt (Co), or the like.

The self-forming metal capping layer CP1 is disposed on the metal layer MT1. The self-forming metal capping layer CP1 only covers the metal layer MT1 and does not cover the interlayer dielectric layer ILD1. The material of the self-forming metal capping layer CP1 is, for example, vanadium (V), niobium (Nb), molybdenum (Mo), tungsten (W), manganese (Mn), the like, or a combination thereof. In this embodiment, the self-forming metal capping layer CP1 is formed through a thermal treatment, a photo treatment or a bias-assist treatment on a metal conductor with metal dopants. The metal conductor with the metal dopants is filled in the trench TC1. After the thermal treatment, the photo treatment or the bias-assist treatment, the dopants will be gathered at the top of the metal conductor to form the metal layer MT1 and the self-forming metal capping layer CP1 disposed thereon.

The etching stop bi-layer structure ESBS1 includes, for example, a conformal etching stop layer ESL1, a hermetic layer HM1, a conformal etching stop layer ESL2, and a hermetic layer HM2. The conformal etching stop layer ESL1 is disposed on the interlayer dielectric layer ILD1 and the self-forming metal capping layer CP1. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2. The material of the conformal etching stop layer ESL1 and the conformal etching stop layer ESL2 is, for example, silicon carbon nitride (SiCxNy), boron nitride (BN), boron carbonitride (BCN), silicon oxycarbonitride (SiOCN), silicon oxycarbide (SiOC), the like, or a combination thereof. The material of the hermetic layer HM1 and the hermetic layer HM2 is, for example, nitride, oxide, polyimide, polybenzoxazole, the like, or a combination thereof.

The interlayer dielectric layer ILD2 is disposed on the etching stop bi-layer structure ESBS1. The via VA and the metal layer MT2 are embedded in the interlayer dielectric layer ILD2. The material of the interlayer dielectric layer ILD2 is, for example, silicon oxide (SiO), silicon oxycarbide (SiCO), silicon carbon nitride (SiCN), silicon oxycarbonitride (SiCON), silicon oxynitride (SiNO), silicon nitride (SiN), the like or a combination thereof. The material of the metal layer MT2 is, for example, tungsten (W), ruthenium (Ru), cobalt (Co), copper (Cu), aluminum (Al), nickel (Ni), gold (Au), silver (Ag), gold-aluminum (AuAl), molybdenum (Mo), the like, or a combination thereof.

The barrier layer BR2 and the liner layer LN2 are disposed between the interlayer dielectric layer ILD2 and the via VA, between the interlayer dielectric layer ILD2 and the metal layer MT2, and between the via VA and the self-forming metal capping layer CP1. The material of the barrier layer BR2 is, for example, titanium nitride (TiN), tantalum nitride (TaN) or silicon nitride (SiN), the like, or a combination thereof. The material of the liner layer LN1 is, for example, cobalt (Co), or the like.

In the embodiment shown in the FIG. 1, the self-forming metal capping layer CP1 is self-formed on the metal layer MT1 without any selective deposition process. Therefore, any metallic residue would not be formed on the interface between the interlayer dielectric layer ILD1 and the etching stop bi-layer structure ESBS1. The selectivity loss issue which caused by conventional metal-on-metal (MoM) selective deposition process for the metal cap would be avoided.

Figure 2:
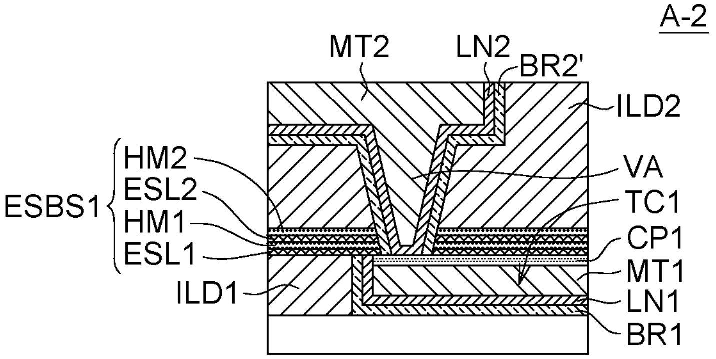
FIG. 2 shows a semiconductor structure A-2 according to another embodiment.

Please refer to FIG. 2, which shows a semiconductor structure A-2 according to another embodiment. The semiconductor structure A-2 is an interconnection for two metal layers MT1, MT2 with dual damascene in the back-end-of-line (BEOL) process. The semiconductor structure A-2 includes, for example, the interlayer dielectric (ILD) layer ILD1, the barrier layer BR1, the liner layer LN1, the metal layer MT1, the self-forming metal capping layer CP1, the etching stop bi-layer structure ESBS1, the interlayer dielectric layer ILD2, a barrier layer BR2', the liner layer LN2, the via VA and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The self-forming metal capping layer CP1 is disposed on the metal layer MT1. The self-forming metal capping layer CP1 only covers the metal layer MT1 and does not cover the interlayer dielectric layer ILD1. In this embodiment, the self-forming metal capping layer CP1 is formed through the thermal treatment, the photo treatment or the bias-assist treatment on the metal conductor with metal dopants. The metal conductor with the metal dopants is filled in the trench TC1. After the thermal treatment, the photo treatment or the bias-assist treatment, the dopants will be gathered at the top of the metal conductor to form the metal layer MT1 and the self-forming metal capping layer CP1 disposed thereon.

The etching stop bi-layer structure ESBS1 includes, for example, the conformal etching stop layer ESL1, the hermetic layer HM1, the conformal etching stop layer ESL2, and the hermetic layer HM2. The conformal etching stop layer ESL1 is disposed on the interlayer dielectric layer ILD1 and the self-forming metal capping layer CP1. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2.

The interlayer dielectric layer ILD2 is disposed on the etching stop bi-layer structure ESBS1. The via VA and the metal layer MT2 are embedded in the interlayer dielectric layer ILD2.

The barrier layer BR2' and the liner layer LN2 are disposed between the interlayer dielectric layer ILD2 and the via VA, between the interlayer dielectric layer ILD2 and the metal layer MT2. Only the liner layer LN2 is disposed between the via VA and the self-forming metal capping layer CP1.

In the embodiment shown in the FIG. 2, the self-forming metal capping layer CP1 is self-formed on the metal layer MT1 without any selective deposition process. Therefore, any metallic residue would not be formed on the interface between the interlayer dielectric layer ILD1 and the etching stop bi-layer structure ESBS1. The selectivity loss issue which caused by conventional metal-on-metal (MoM) selective deposition process for the metal cap would be avoided.

Figure 3:
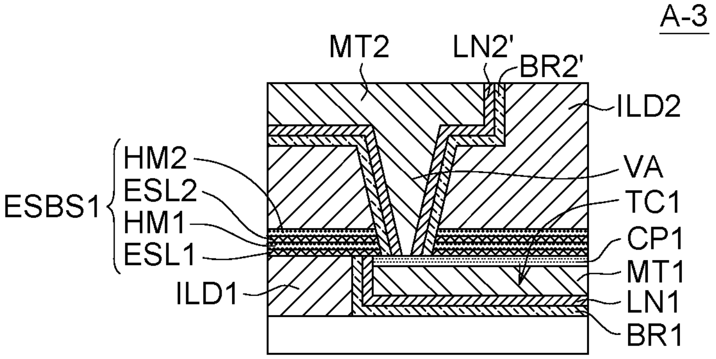
FIG. 3 shows a semiconductor structure A-3 according to another embodiment.

Please refer to FIG. 3, which shows a semiconductor structure A-3 according to another embodiment. The semiconductor structure A-3 is an interconnection for two metal layers MT1, MT2 with dual damascene in the back-end-of-line (BEOL) process. The semiconductor structure A-3 includes, for example, the interlayer dielectric (ILD) layer ILD1, the barrier layer BR1, the liner layer LN1, the metal layer MT1, the self-forming metal capping layer CP1, the etching stop bi-layer structure ESBS1, the interlayer dielectric layer ILD2, the barrier layer BR2', a liner layer LN2', the via VA and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The self-forming metal capping layer CP1 is disposed on the metal layer MT1. The self-forming metal capping layer CP1 only covers the metal layer MT1 and does not cover the interlayer dielectric layer ILD1. In this embodiment, the self-forming metal capping layer CP1 is formed through the thermal treatment, the photo treatment or the bias-assist treatment on the metal conductor with metal dopants. The metal conductor with the metal dopants is filled in the trench TC1. After the thermal treatment, the photo treatment or the bias-assist treatment, the dopants will be gathered at the top of the metal conductor to form the metal layer MT1 and the self-forming metal capping layer CP1 disposed thereon.

The etching stop bi-layer structure ESBS1 includes, for example, the conformal etching stop layer ESL1, the hermetic layer HM1, the conformal etching stop layer ESL2, and the hermetic layer HM2. The conformal etching stop layer ESL1 is disposed on the interlayer dielectric layer ILD1 and the self-forming metal capping layer CP1. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2.

The interlayer dielectric layer ILD2 is disposed on the etching stop bi-layer structure ESBS1. The via VA and the metal layer MT2 are embedded in the interlayer dielectric layer ILD2.

The barrier layer BR2' and the liner layer LN2' are disposed between the interlayer dielectric layer ILD2 and the via VA, and between the interlayer dielectric layer ILD2 and the metal layer MT2. The via VA is directly connected to the self-forming metal capping layer CP1 and the barrier layer BR2' and the liner layer LN2' are not disposed between the via VA and the self-forming metal capping layer CP1.

In the embodiment shown in the FIG. 3, the self-forming metal capping layer CP1 is self-formed on the metal layer MT1 without any selective deposition process. Therefore, any metallic residue would not be formed on the interface between the interlayer dielectric layer ILD1 and the etching stop bi-layer structure ESBS1. The selectivity loss issue which caused by conventional metal-on-metal (MoM) selective deposition process for the metal cap would be avoided.

Figure 4:
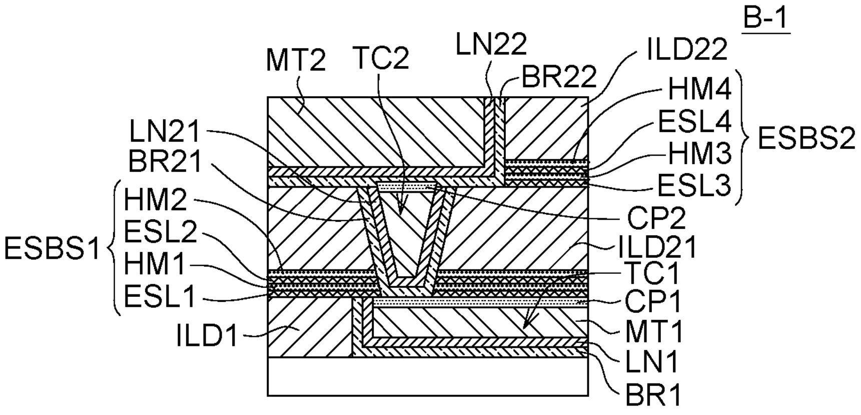
FIG. 4 shows a semiconductor structure B-1 according to another embodiment.

Please refer to FIG. 4, which shows a semiconductor structure B-1 according to another embodiment. The semiconductor structure B-1 is an interconnection for two metal layers MT1, MT2 with single damascene in the back-end-of-line (BEOL) process. The semiconductor structure B-1 includes, for example, the interlayer dielectric (ILD) layer ILD1, the barrier layer BR1, the liner layer LN1, the metal layer MT1, the self-forming metal capping layer CP1, the etching stop bi-layer structure ESBS1, an interlayer dielectric layer ILD21, a barrier layer BR21, a liner layer LN21, the via VA, a self-forming metal capping layer CP2, an etching stop bi-layer structure ESBS2, an interlayer dielectric layer ILD22, a barrier layer BR22, a liner layer LN22 and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The self-forming metal capping layer CP1 is disposed on the metal layer MT1. The self-forming metal capping layer CP1 only covers the metal layer MT1 and does not cover the interlayer dielectric layer ILD1. In this embodiment, the self-forming metal capping layer CP1 is formed through the thermal treatment, the photo treatment or the bias-assist treatment on the metal conductor with metal dopants. The metal conductor with the metal dopants is filled in the trench TC1. After the thermal treatment, the photo treatment or the bias-assist treatment, the dopants will be gathered at the top of the metal conductor to form the metal layer MT1 and the self-forming metal capping layer CP1 disposed thereon.

The etching stop bi-layer structure ESBS1 includes, for example, the conformal etching stop layer ESL1, the hermetic layer HM1, the conformal etching stop layer ESL2, and the hermetic layer HM2. The conformal etching stop layer ESL1 is disposed on the interlayer dielectric layer ILD1 and the self-forming metal capping layer CP1. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2.

The interlayer dielectric layer ILD21 is disposed on the etching stop bi-layer structure ESBS1. The via VA is embedded in the interlayer dielectric layer ILD21.

The barrier layer BR21 and the liner layer LN21 are disposed between the interlayer dielectric layer ILD21 and the via VA, and between the via VA and the self-forming metal capping layer CP1.

The self-forming metal capping layer CP2 is disposed on the via VA. The self-forming metal capping layer CP2 only covers the via VA and does not cover the interlayer dielectric layer ILD21. The material of the self-forming metal capping layer CP2 is, for example, vanadium (V), niobium (Nb), molybdenum (Mo), tungsten (W), manganese (Mn), the like, or a combination thereof. In this embodiment, the self-forming metal capping layer CP2 is formed through a thermal treatment, a photo treatment or a bias-assist treatment on a metal conductor with metal dopants. The metal conductor with the metal dopants is filled in the trench TC2. After the thermal treatment, the photo treatment or the bias-assist treatment, the dopants will be gathered at the top of the metal conductor to form the via VA and the self-forming metal capping layer CP2 disposed thereon.

The etching stop bi-layer structure ESBS2 includes, for example, a conformal etching stop layer ESL3, a hermetic layer HM3, a conformal etching stop layer ESL4, and a hermetic layer HM4. The conformal etching stop layer ESL3 is disposed on the interlayer dielectric layer ILD21. The hermetic layer HM3 is disposed on the conformal etching stop layer ESL3. The conformal etching stop layer ESL4 is disposed on the hermetic layer HM3. The hermetic layer HM4 is disposed on the conformal etching stop layer ESL4. The material of the conformal etching stop layer ESL3 and the conformal etching stop layer ESL4 is, for example, silicon carbon nitride (SiCxNy), boron nitride (BN), boron carbonitride (BCN), silicon oxycarbonitride (SiOCN), silicon oxycarbide (SiOC), the like, or a combination thereof. The material of the hermetic layer HM3 and the hermetic layer HM4 is, for example, nitride, oxide, polyimide, polybenzoxazole, the like, or a combination thereof.

The interlayer dielectric layer ILD22 is disposed on the etching stop bi-layer structure ESBS2. The metal layer MT2 is embedded in the interlayer dielectric layer ILD22. The material of the interlayer dielectric layer ILD22 is, for example, silicon oxide (SiO), silicon oxycarbide (SiCO), silicon carbon nitride (SiCN), silicon oxycarbonitride (SiCON), silicon oxynitride (SiNO), silicon nitride (SiN), the like or a combination thereof.

The barrier layer BR22 and the liner layer LN22 are disposed between the interlayer dielectric layer ILD22 and the metal layer MT2, between the interlayer dielectric layer ILD21 and the metal layer MT2, and between the self-forming metal capping layer CP2 and the metal layer MT2.

In the embodiment shown in the FIG. 4, the self-forming metal capping layer CP1 is self-formed on the metal layer MT1 without any selective deposition process. Therefore, any metallic residue would not be formed on the interface between the interlayer dielectric layer ILD1 and the etching stop bi-layer structure ESBS1. The self-forming metal capping layer CP2 is self-formed on the via VA without any selective deposition process. Therefore, any metallic residue would not be formed on the interface between the interlayer dielectric layer ILD21 and the etching stop bi-layer structure ESBS2. The selectivity loss issue which caused by conventional metal-on-metal (MoM) selective deposition process for the metal cap would be avoided.

Figure 5:
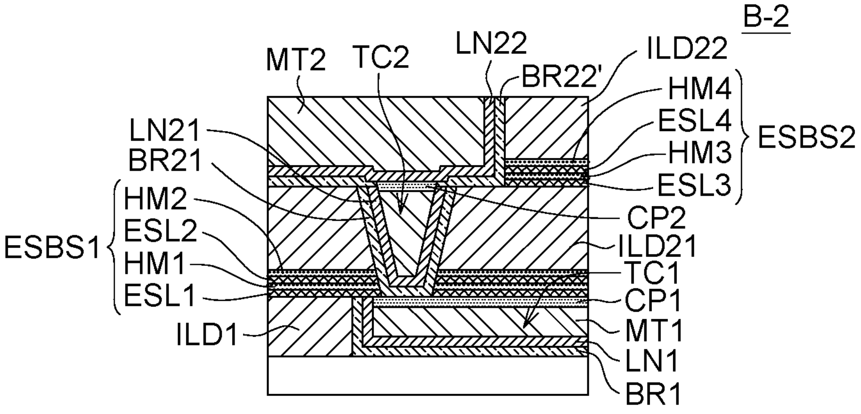
FIG. 5 shows a semiconductor structure B-2 according to another embodiment.

Please refer to FIG. 5, which shows a semiconductor structure B-2 according to another embodiment. The semiconductor structure B-2 is an interconnection for two metal layers MT1, MT2 with single damascene in the back-end-of-line (BEOL) process. The semiconductor structure B-2 includes, for example, the interlayer dielectric (ILD) layer ILD1, the barrier layer BR1, the liner layer LN1, the metal layer MT1, the self-forming metal capping layer CP1, the etching stop bi-layer structure ESBS1, the interlayer dielectric layer ILD21, the barrier layer BR21, the liner layer LN21, the via VA, the self-forming metal capping layer CP2, the etching stop bi-layer structure ESBS2, the interlayer dielectric layer ILD22, a barrier layer BR22', the liner layer LN22 and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The self-forming metal capping layer CP1 is disposed on the metal layer MT1. The self-forming metal capping layer CP1 only covers the metal layer MT1 and does not cover the interlayer dielectric layer ILD1. In this embodiment, the self-forming metal capping layer CP1 is formed through the thermal treatment, the photo treatment or the bias-assist treatment on the metal conductor with metal dopants. The metal conductor with the metal dopants is filled in the trench TC1. After the thermal treatment, the photo treatment or the bias-assist treatment, the dopants will be gathered at the top of the metal conductor to form the metal layer MT1 and the self-forming metal capping layer CP1 disposed thereon.

The etching stop bi-layer structure ESBS1 includes, for example, the conformal etching stop layer ESL1, the hermetic layer HM1, the conformal etching stop layer ESL2, and the hermetic layer HM2. The conformal etching stop layer ESL1 is disposed on the interlayer dielectric layer ILD1 and the self-forming metal capping layer CP1. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2.

The interlayer dielectric layer ILD21 is disposed on the etching stop bi-layer structure ESBS1. The via VA is embedded in the interlayer dielectric layer ILD21.

The barrier layer BR21 and the liner layer LN21 are disposed between the interlayer dielectric layer ILD21 and the via VA, and between the via VA and the self-forming metal capping layer CP1.

The self-forming metal capping layer CP2 is disposed on the via VA. The self-forming metal capping layer CP2 only covers the via VA and does not cover the interlayer dielectric layer ILD21. In this embodiment, the self-forming metal capping layer CP2 is formed through a thermal treatment, a photo treatment or a bias-assist treatment on a metal conductor with metal dopants. The metal conductor with the metal dopants is filled in the trench TC2. After the thermal treatment, the photo treatment or the bias-assist treatment, the dopants will be gathered at the top of the metal conductor to form the via VA and the self-forming metal capping layer CP2 disposed thereon.

The etching stop bi-layer structure ESBS2 includes, for example, a conformal etching stop layer ESL3, a hermetic layer HM3, a conformal etching stop layer ESL4, and a hermetic layer HM4. The conformal etching stop layer ESL3 is disposed on the interlayer dielectric layer ILD21. The hermetic layer HM3 is disposed on the conformal etching stop layer ESL3. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2. The metal layer MT2 is embedded in the interlayer dielectric layer ILD22.

The barrier layer BR22' and the liner layer LN22 are disposed between the interlayer dielectric layer ILD22 and the metal layer MT2, and between the interlayer dielectric layer ILD21 and the metal layer MT2. Only the liner layer LN22 is disposed between the self-forming metal capping layer CP2 and the metal layer MT2, and the barrier layer BR22' is not located between the self-forming metal capping layer CP2 and the metal layer MT2.

In the embodiment shown in the FIG. 5, the self-forming metal capping layer CP1 is self-formed on the metal layer MT1 without any selective deposition process. Therefore, any metallic residue would not be formed on the interface between the interlayer dielectric layer ILD1 and the etching stop bi-layer structure ESBS1. The self-forming metal capping layer CP2 is self-formed on the via VA without any selective deposition process. Therefore, any metallic residue would not be formed on the interface between the interlayer dielectric layer ILD21 and the etching stop bi-layer structure ESBS2. The selectivity loss issue which caused by conventional metal-on-metal (MoM) selective deposition process for the metal cap would be avoided.

Figure 6:
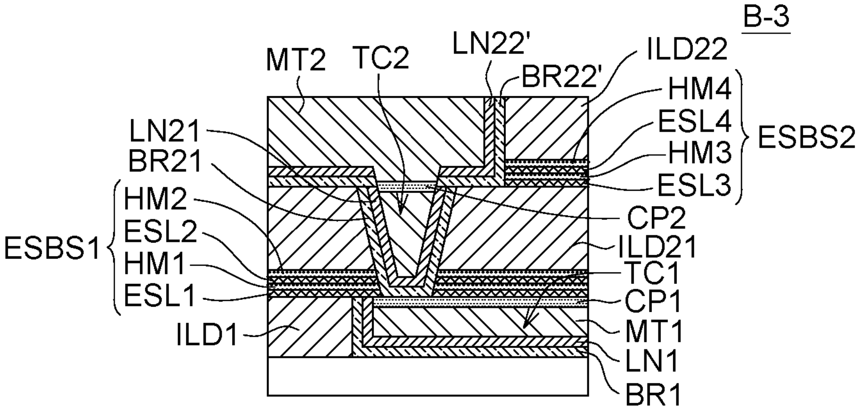
FIG. 6 shows a semiconductor structure B-3 according to another embodiment.

Please refer to FIG. 6, which shows a semiconductor structure B-3 according to another embodiment. The semiconductor structure B-3 is an interconnection for two metal layers MT1, MT2 with single damascene in the back-end-of-line (BEOL) process. The semiconductor structure B-3 includes, for example, the interlayer dielectric (ILD) layer ILD1, the barrier layer BR1, the liner layer LN1, the metal layer MT1, the self-forming metal capping layer CP1, the etching stop bi-layer structure ESBS1, the interlayer dielectric layer ILD21, the barrier layer BR21, the liner layer LN21, the via VA, the self-forming metal capping layer CP2, the etching stop bi-layer structure ESBS2, the interlayer dielectric layer ILD22, the barrier layer BR22', a liner layer LN22' and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The self-forming metal capping layer CP1 is disposed on the metal layer MT1. The self-forming metal capping layer CP1 only covers the metal layer MT1 and does not cover the interlayer dielectric layer ILD1. In this embodiment, the self-forming metal capping layer CP1 is formed through the thermal treatment, the photo treatment or the bias-assist treatment on the metal conductor with metal dopants. The metal conductor with the metal dopants is filled in the trench TC1. After the thermal treatment, the photo treatment or the bias-assist treatment, the dopants will be gathered at the top of the metal conductor to form the metal layer MT1 and the self-forming metal capping layer CP1 disposed thereon.

The etching stop bi-layer structure ESBS1 includes, for example, the conformal etching stop layer ESL1, the hermetic layer HM1, the conformal etching stop layer ESL2, and the hermetic layer HM2. The conformal etching stop layer ESL1 is disposed on the interlayer dielectric layer ILD1 and the self-forming metal capping layer CP1. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2.

The interlayer dielectric layer ILD21 is disposed on the etching stop bi-layer structure ESBS1. The via VA is embedded in the interlayer dielectric layer ILD21.

The barrier layer BR21 and the liner layer LN21 are disposed between the interlayer dielectric layer ILD21 and the via VA, and between the via VA and the self-forming metal capping layer CP1.

The self-forming metal capping layer CP2 is disposed on the via VA. The self-forming metal capping layer CP2 only covers the via VA and does not cover the interlayer dielectric layer ILD21. In this embodiment, the self-forming metal capping layer CP2 is formed through a thermal treatment, a photo treatment or a bias-assist treatment on a metal conductor with metal dopants. The metal conductor with the metal dopants is filled in the trench TC2. After the thermal treatment, the photo treatment or the bias-assist treatment, the dopants will be gathered at the top of the metal conductor to form the via VA and the self-forming metal capping layer CP2 disposed thereon.

The etching stop bi-layer structure ESBS2 includes, for example, a conformal etching stop layer ESL3, a hermetic layer HM3, a conformal etching stop layer ESL4, and a hermetic layer HM4. The conformal etching stop layer ESL3 is disposed on the interlayer dielectric layer ILD21. The hermetic layer HM3 is disposed on the conformal etching stop layer ESL3. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2. The metal layer MT2 is embedded in the interlayer dielectric layer ILD22.

The barrier layer BR22' and the liner layer LN22' are disposed between the interlayer dielectric layer ILD22 and the metal layer MT2, and between the interlayer dielectric layer ILD21 and the metal layer MT2. The metal layer MT2 is directly connected to the self-forming metal capping layer CP2. The barrier BR22' and the liner layer LN22' are not disposed between the self-forming metal capping layer CP2 and the metal layer MT2.

In the embodiment shown in the FIG. 6, the self-forming metal capping layer CP1 is self-formed on the metal layer MT1 without any selective deposition process. Therefore, any metallic residue would not be formed on the interface between the interlayer dielectric layer ILD1 and the etching stop bi-layer structure ESBS1. The self-forming metal capping layer CP2 is self-formed on the via VA without any selective deposition process. Therefore, any metallic residue would not be formed on the interface between the interlayer dielectric layer ILD21 and the etching stop bi-layer structure ESBS2. The selectivity loss issue which caused by conventional metal-on-metal (MoM) selective deposition process for the metal cap would be avoided.

Figure 7:
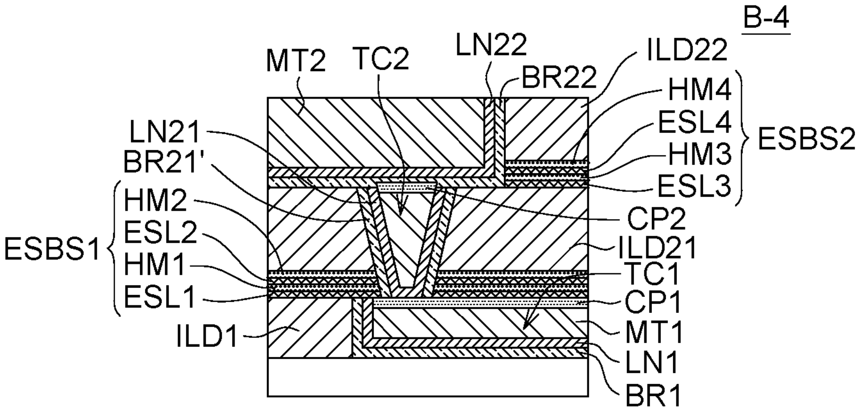
FIG. 7 shows a semiconductor structure B-4 according to another embodiment.

Please refer to FIG. 7, which shows a semiconductor structure B-4 according to another embodiment. The semiconductor structure B-4 is an interconnection for two metal layers MT1, MT2 with single damascene in the back-end-of-line (BEOL) process. The semiconductor structure B-4 includes, for example, the interlayer dielectric (ILD) layer ILD1, the barrier layer BR1, the liner layer LN1, the metal layer MT1, the self-forming metal capping layer CP1, the etching stop bi-layer structure ESBS1, an interlayer dielectric layer ILD21, a barrier layer BR21', the liner layer LN21, the via VA, the self-forming metal capping layer CP2, the etching stop bi-layer structure ESBS2, the interlayer dielectric layer ILD22, the barrier layer BR22, the liner layer LN22 and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The self-forming metal capping layer CP1 is disposed on the metal layer MT1. The self-forming metal capping layer CP1 only covers the metal layer MT1 and does not cover the interlayer dielectric layer ILD1. In this embodiment, the self-forming metal capping layer CP1 is formed through the thermal treatment, the photo treatment or the bias-assist treatment on the metal conductor with metal dopants. The metal conductor with the metal dopants is filled in the trench TC1. After the thermal treatment, the photo treatment or the bias-assist treatment, the dopants will be gathered at the top of the metal conductor to form the metal layer MT1 and the self-forming metal capping layer CP1 disposed thereon.

The etching stop bi-layer structure ESBS1 includes, for example, the conformal etching stop layer ESL1, the hermetic layer HM1, the conformal etching stop layer ESL2, and the hermetic layer HM2. The conformal etching stop layer ESL1 is disposed on the interlayer dielectric layer ILD1 and the self-forming metal capping layer CP1. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2.

The interlayer dielectric layer ILD21 is disposed on the etching stop bi-layer structure ESBS1. The via VA is embedded in the interlayer dielectric layer ILD21.

The barrier layer BR21' and the liner layer LN21 are disposed between the interlayer dielectric layer ILD21 and the via VA. Only the liner layer LN21 is disposed between the via VA and the self-forming metal capping layer CP1. The barrier layer BR21' is not disposed between the via VA and the self-forming metal capping layer CP1.

The self-forming metal capping layer CP2 is disposed on the via VA. The self-forming metal capping layer CP2 only covers the via VA and does not cover the interlayer dielectric layer ILD21. In this embodiment, the self-forming metal capping layer CP2 is formed through the thermal treatment, the photo treatment or the bias-assist treatment on the metal conductor with metal dopants. The metal conductor with the metal dopants is filled in the trench TC2. After the thermal treatment, the photo treatment or the bias-assist treatment, the dopants will be gathered at the top of the metal conductor to form the via VA and the self-forming metal capping layer CP2 disposed thereon.

The etching stop bi-layer structure ESBS2 includes, for example, the conformal etching stop layer ESL3, the hermetic layer HM3, the conformal etching stop layer ESL4, and the hermetic layer HM4. The conformal etching stop layer ESL3 is disposed on the interlayer dielectric layer ILD21. The hermetic layer HM3 is disposed on the conformal etching stop layer ESL3. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2. The metal layer MT2 is embedded in the interlayer dielectric layer ILD22.

The barrier layer BR22 and the liner layer LN22 are disposed between the interlayer dielectric layer ILD22 and the metal layer MT2, between the interlayer dielectric layer ILD21 and the metal layer MT2, and between the self-forming metal capping layer CP2 and the metal layer MT2.

In the embodiment shown in the FIG. 7, the self-forming metal capping layer CP1 is self-formed on the metal layer MT1 without any selective deposition process. Therefore, any metallic residue would not be formed on the interface between the interlayer dielectric layer ILD1 and the etching stop bi-layer structure ESBS1. The self-forming metal capping layer CP2 is self-formed on the via VA without any selective deposition process. Therefore, any metallic residue would not be formed on the interface between the interlayer dielectric layer ILD21 and the etching stop bi-layer structure ESBS2. The selectivity loss issue which caused by conventional metal-on-metal (MoM) selective deposition process for the metal cap would be avoided.

Figure 8:
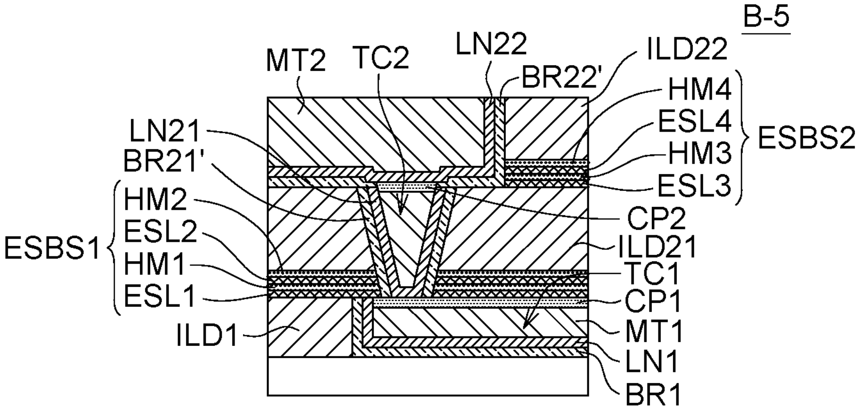
FIG. 8 shows a semiconductor structure B-5 according to another embodiment.

Please refer to FIG. 8, which shows a semiconductor structure B-5 according to another embodiment. The semiconductor structure B-5 is an interconnection for two metal layers MT1, MT2 with single damascene in the back-end-of-line (BEOL) process. The semiconductor structure B-5 includes, for example, the interlayer dielectric (ILD) layer ILD1, the barrier layer BR1, the liner layer LN1, the metal layer MT1, the self-forming metal capping layer CP1, the etching stop bi-layer structure ESBS1, an interlayer dielectric layer ILD21, the barrier layer BR21', the liner layer LN21, the via VA, the self-forming metal capping layer CP2, the etching stop bi-layer structure ESBS2, the interlayer dielectric layer ILD22, a barrier layer BR22', the liner layer LN22 and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The self-forming metal capping layer CP1 is disposed on the metal layer MT1. The self-forming metal capping layer CP1 only covers the metal layer MT1 and does not cover the interlayer dielectric layer ILD1. In this embodiment, the self-forming metal capping layer CP1 is formed through the thermal treatment, the photo treatment or the bias-assist treatment on the metal conductor with metal dopants. The metal conductor with the metal dopants is filled in the trench TC1. After the thermal treatment, the photo treatment or the bias-assist treatment, the dopants will be gathered at the top of the metal conductor to form the metal layer MT1 and the self-forming metal capping layer CP1 disposed thereon.

The etching stop bi-layer structure ESBS1 includes, for example, the conformal etching stop layer ESL1, the hermetic layer HM1, the conformal etching stop layer ESL2, and the hermetic layer HM2. The conformal etching stop layer ESL1 is disposed on the interlayer dielectric layer ILD1 and the self-forming metal capping layer CP1. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2.

The interlayer dielectric layer ILD21 is disposed on the etching stop bi-layer structure ESBS1. The via VA is embedded in the interlayer dielectric layer ILD21.

The barrier layer BR21' and the liner layer LN21 are disposed between the interlayer dielectric layer ILD21 and the via VA. Only the liner layer LN21 is disposed between the via VA and the self-forming metal capping layer CP1. The barrier layer BR21' is not disposed between the via VA and the self-forming metal capping layer CP1.

The self-forming metal capping layer CP2 is disposed on the via VA. The self-forming metal capping layer CP2 only covers the via VA and does not cover the interlayer dielectric layer ILD21. In this embodiment, the self-forming metal capping layer CP2 is formed through the thermal treatment, the photo treatment or the bias-assist treatment on the metal conductor with metal dopants. The metal conductor with the metal dopants is filled in the trench TC2. After the thermal treatment, the photo treatment or the bias-assist treatment, the dopants will be gathered at the top of the metal conductor to form the via VA and the self-forming metal capping layer CP2 disposed thereon.

The etching stop bi-layer structure ESBS2 includes, for example, the conformal etching stop layer ESL3, the hermetic layer HM3, the conformal etching stop layer ESL4, and the hermetic layer HM4. The conformal etching stop layer ESL3 is disposed on the interlayer dielectric layer ILD21. The hermetic layer HM3 is disposed on the conformal etching stop layer ESL3. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2. The metal layer MT2 is embedded in the interlayer dielectric layer ILD22.

The barrier layer BR22' and the liner layer LN22 are disposed between the interlayer dielectric layer ILD22 and the metal layer MT2, between the interlayer dielectric layer ILD21 and the metal layer MT2. Only the liner layer LN22 is disposed between the self-forming metal capping layer CP2 and the metal layer MT2. The barrier layer BR22' is not disposed between the self-forming metal capping layer CP2 and the metal layer MT2.

In the embodiment shown in the FIG. 8, the self-forming metal capping layer CP1 is self-formed on the metal layer MT1 without any selective deposition process. Therefore, any metallic residue would not be formed on the interface between the interlayer dielectric layer ILD1 and the etching stop bi-layer structure ESBS1. The self-forming metal capping layer CP2 is self-formed on the via VA without any selective deposition process. Therefore, any metallic residue would not be formed on the interface between the interlayer dielectric layer ILD21 and the etching stop bi-layer structure ESBS2. The selectivity loss issue which caused by conventional metal-on-metal (MoM) selective deposition process for the metal cap would be avoided.

Figure 9:
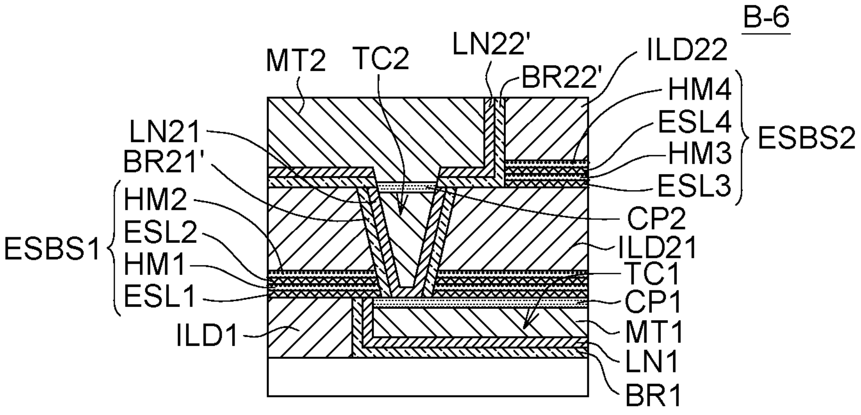
FIG. 9 shows a semiconductor structure B-6 according to another embodiment.

Please refer to FIG. 9, which shows a semiconductor structure B-6 according to another embodiment. The semiconductor structure B-6 is an interconnection for two metal layers MT1, MT2 with single damascene in the back-end-of-line (BEOL) process. The semiconductor structure B-6 includes, for example, the interlayer dielectric (ILD) layer ILD1, the barrier layer BR1, the liner layer LN1, the metal layer MT1, the self-forming metal capping layer CP1, the etching stop bi-layer structure ESBS1, an interlayer dielectric layer ILD21, the barrier layer BR21', the liner layer LN21, the via VA, the self-forming metal capping layer CP2, the etching stop bi-layer structure ESBS2, the interlayer dielectric layer ILD22, the barrier layer BR22', a liner layer LN22' and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The self-forming metal capping layer CP1 is disposed on the metal layer MT1. The self-forming metal capping layer CP1 only covers the metal layer MT1 and does not cover the interlayer dielectric layer ILD1. In this embodiment, the self-forming metal capping layer CP1 is formed through the thermal treatment, the photo treatment or the bias-assist treatment on the metal conductor with metal dopants. The metal conductor with the metal dopants is filled in the trench TC1. After the thermal treatment, the photo treatment or the bias-assist treatment, the dopants will be gathered at the top of the metal conductor to form the metal layer MT1 and the self-forming metal capping layer CP1 disposed thereon.

The etching stop bi-layer structure ESBS1 includes, for example, the conformal etching stop layer ESL1, the hermetic layer HM1, the conformal etching stop layer ESL2, and the hermetic layer HM2. The conformal etching stop layer ESL1 is disposed on the interlayer dielectric layer ILD1 and the self-forming metal capping layer CP1. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2.

The interlayer dielectric layer ILD21 is disposed on the etching stop bi-layer structure ESBS1. The via VA is embedded in the interlayer dielectric layer ILD21.

The barrier layer BR21' and the liner layer LN21 are disposed between the interlayer dielectric layer ILD21 and the via VA. Only the liner layer LN21 is disposed between the via VA and the self-forming metal capping layer CP1. The barrier layer BR21' is not disposed between the via VA and the self-forming metal capping layer CP1.

The self-forming metal capping layer CP2 is disposed on the via VA. The self-forming metal capping layer CP2 only covers the via VA and does not cover the interlayer dielectric layer ILD21. In this embodiment, the self-forming metal capping layer CP2 is formed through the thermal treatment, the photo treatment or the bias-assist treatment on the metal conductor with metal dopants. The metal conductor with the metal dopants is filled in the trench TC2. After the thermal treatment, the photo treatment or the bias-assist treatment, the dopants will be gathered at the top of the metal conductor to form the via VA and the self-forming metal capping layer CP2 disposed thereon.

The etching stop bi-layer structure ESBS2 includes, for example, the conformal etching stop layer ESL3, the hermetic layer HM3, the conformal etching stop layer ESL4, and the hermetic layer HM4. The conformal etching stop layer ESL3 is disposed on the interlayer dielectric layer ILD21. The hermetic layer HM3 is disposed on the conformal etching stop layer ESL3. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2. The metal layer MT2 is embedded in the interlayer dielectric layer ILD22. The material of the interlayer dielectric layer ILD22 is, for example, silicon oxide (SiO), silicon oxycarbide (SiCO), silicon carbon nitride (SiCN), silicon oxycarbonitride (SiCON), silicon oxynitride (SiNO), silicon nitride (SiN), the like or a combination thereof.

The barrier layer BR22' and the liner layer LN22' are disposed between the interlayer dielectric layer ILD22 and the metal layer MT2, between the interlayer dielectric layer ILD21 and the metal layer MT2. The metal layer MT2 is directly connected to the self-forming metal layer CP2. The barrier layer BR22' and liner layer LN22*s* are not disposed between the self-forming metal capping layer CP2 and the metal layer MT2.

In the embodiment shown in the FIG. 9, the self-forming metal capping layer CP1 is self-formed on the metal layer MT1 without any selective deposition process. Therefore, any metallic residue would not be formed on the interface between the interlayer dielectric layer ILD1 and the etching stop bi-layer structure ESBS1. The self-forming metal capping layer CP2 is self-formed on the via VA without any selective deposition process. Therefore, any metallic residue would not be formed on the interface between the interlayer dielectric layer ILD21 and the etching stop bi-layer structure ESBS2. The selectivity loss issue which caused by conventional metal-on-metal (MoM) selective deposition process for the metal cap would be avoided.

Figure 10:
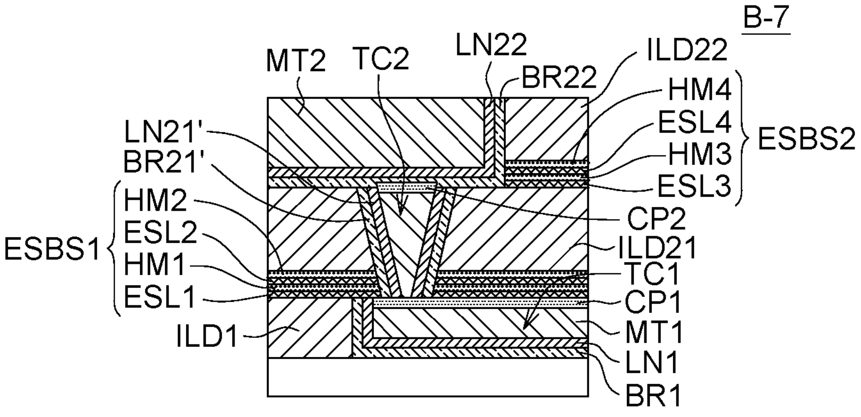
FIG. 10 shows a semiconductor structure B-7 according to another embodiment.

Please refer to FIG. 10, which shows a semiconductor structure B-7 according to another embodiment. The semiconductor structure B-7 is an interconnection for two metal layers MT1, MT2 with single damascene in the back-end-of-line (BEOL) process. The semiconductor structure B-7 includes, for example, the interlayer dielectric (ILD) layer ILD1, the barrier layer BR1, the liner layer LN1, the metal layer MT1, the self-forming metal capping layer CP1, the etching stop bi-layer structure ESBS1, an interlayer dielectric layer ILD21, the barrier layer BR21', a liner layer LN21', the via VA, the self-forming metal capping layer CP2, the etching stop bi-layer structure ESBS2, the interlayer dielectric layer ILD22, the barrier layer BR22, the liner layer LN22 and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The self-forming metal capping layer CP1 is disposed on the metal layer MT1. The self-forming metal capping layer CP1 only covers the metal layer MT1 and does not cover the interlayer dielectric layer ILD1. In this embodiment, the self-forming metal capping layer CP1 is formed through the thermal treatment, the photo treatment or the bias-assist treatment on the metal conductor with metal dopants. The metal conductor with the metal dopants is filled in the trench TC1. After the thermal treatment, the photo treatment or the bias-assist treatment, the dopants will be gathered at the top of the metal conductor to form the metal layer MT1 and the self-forming metal capping layer CP1 disposed thereon.

The etching stop bi-layer structure ESBS1 includes, for example, the conformal etching stop layer ESL1, the hermetic layer HM1, the conformal etching stop layer ESL2, and the hermetic layer HM2. The conformal etching stop layer ESL1 is disposed on the interlayer dielectric layer ILD1 and the self-forming metal capping layer CP1. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2.

The interlayer dielectric layer ILD21 is disposed on the etching stop bi-layer structure ESBS1. The via VA is embedded in the interlayer dielectric layer ILD21.

The barrier layer BR21' and the liner layer LN21' are disposed between the interlayer dielectric layer ILD21 and the via VA. The via VA is directly connected to the self-forming metal layer CP1. The barrier layer BR21' and the liner layer LN21' are not disposed between the via VA and the self-forming metal capping layer CP1.

The self-forming metal capping layer CP2 is disposed on the via VA. The self-forming metal capping layer CP2 only covers the via VA and does not cover the interlayer dielectric layer ILD21. In this embodiment, the self-forming metal capping layer CP2 is formed through the thermal treatment, the photo treatment or the bias-assist treatment on the metal conductor with metal dopants. The metal conductor with the metal dopants is filled in the trench TC2. After the thermal treatment, the photo treatment or the bias-assist treatment, the dopants will be gathered at the top of the metal conductor to form the via VA and the self-forming metal capping layer CP2 disposed thereon.

The etching stop bi-layer structure ESBS2 includes, for example, the conformal etching stop layer ESL3, the hermetic layer HM3, the conformal etching stop layer ESL4, and the hermetic layer HM4. The conformal etching stop layer ESL3 is disposed on the interlayer dielectric layer ILD21. The hermetic layer HM3 is disposed on the conformal etching stop layer ESL3. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2. The metal layer MT2 is embedded in the interlayer dielectric layer ILD22.

The barrier layer BR22 and the liner layer LN22 are disposed between the interlayer dielectric layer ILD22 and the metal layer MT2, between the interlayer dielectric layer ILD21 and the metal layer MT2, and between the self-forming metal capping layer CP2 and the metal layer MT2.

In the embodiment shown in the FIG. 10, the self-forming metal capping layer CP1 is self-formed on the metal layer MT1 without any selective deposition process. Therefore, any metallic residue would not be formed on the interface between the interlayer dielectric layer ILD1 and the etching stop bi-layer structure ESBS1. The self-forming metal capping layer CP2 is self-formed on the via VA without any selective deposition process. Therefore, any metallic residue would not be formed on the interface between the interlayer dielectric layer ILD21 and the etching stop bi-layer structure ESBS2. The selectivity loss issue which caused by conventional metal-on-metal (MoM) selective deposition process for the metal cap would be avoided.

Figure 11:
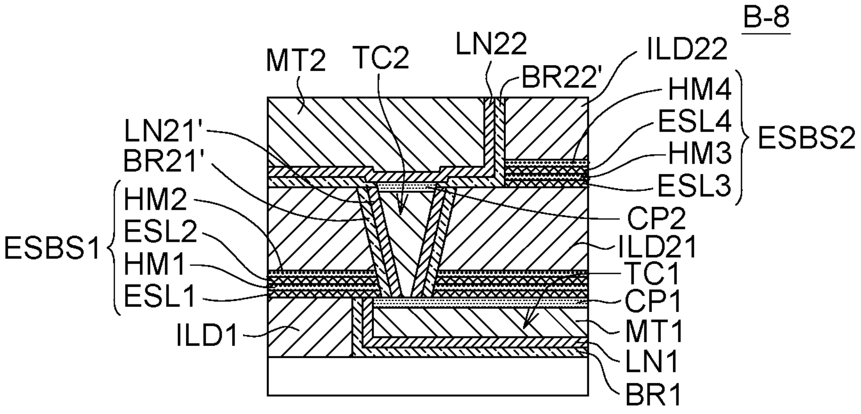
FIG. 11 shows a semiconductor structure B-8 according to another embodiment.

Please refer to FIG. 11, which shows a semiconductor structure B-8 according to another embodiment. The semiconductor structure B-8 is an interconnection for two metal layers MT1, MT2 with single damascene in the back-end-of-line (BEOL) process. The semiconductor structure B-8 includes, for example, the interlayer dielectric (ILD) layer ILD1, the barrier layer BR1, the liner layer LN1, the metal layer MT1, the self-forming metal capping layer CP1, the etching stop bi-layer structure ESBS1, an interlayer dielectric layer ILD21, the barrier layer BR21', the liner layer LN21', the via VA, the self-forming metal capping layer CP2, the etching stop bi-layer structure ESBS2, the interlayer dielectric layer ILD22, the barrier layer BR22', the liner layer LN22 and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The self-forming metal capping layer CP1 is disposed on the metal layer MT1. The self-forming metal capping layer CP1 only covers the metal layer MT1 and does not cover the interlayer dielectric layer ILD1. In this embodiment, the self-forming metal capping layer CP1 is formed through the thermal treatment, the photo treatment or the bias-assist treatment on the metal conductor with metal dopants. The metal conductor with the metal dopants is filled in the trench TC1. After the thermal treatment, the photo treatment or the bias-assist treatment, the dopants will be gathered at the top of the metal conductor to form the metal layer MT1 and the self-forming metal capping layer CP1 disposed thereon.

The etching stop bi-layer structure ESBS1 includes, for example, the conformal etching stop layer ESL1, the hermetic layer HM1, the conformal etching stop layer ESL2, and the hermetic layer HM2. The conformal etching stop layer ESL1 is disposed on the interlayer dielectric layer ILD1 and the self-forming metal capping layer CP1. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2.

The interlayer dielectric layer ILD21 is disposed on the etching stop bi-layer structure ESBS1. The via VA is embedded in the interlayer dielectric layer ILD21.

The barrier layer BR21' and the liner layer LN21' are disposed between the interlayer dielectric layer ILD21 and the via VA. The via VA is directly connected to the self-forming metal layer CP1. The barrier layer BR21' and the liner layer LN21' are not disposed between the via VA and the self-forming metal capping layer CP1.

The self-forming metal capping layer CP2 is disposed on the via VA. The self-forming metal capping layer CP2 only covers the via VA and does not cover the interlayer dielectric layer ILD21. In this embodiment, the self-forming metal capping layer CP2 is formed through the thermal treatment, the photo treatment or the bias-assist treatment on the metal conductor with metal dopants. The metal conductor with the metal dopants is filled in the trench TC2. After the thermal treatment, the photo treatment or the bias-assist treatment, the dopants will be gathered at the top of the metal conductor to form the via VA and the self-forming metal capping layer CP2 disposed thereon.

The etching stop bi-layer structure ESBS2 includes, for example, the conformal etching stop layer ESL3, the hermetic layer HM3, the conformal etching stop layer ESL4, and the hermetic layer HM4. The conformal etching stop layer ESL3 is disposed on the interlayer dielectric layer ILD21. The hermetic layer HM3 is disposed on the conformal etching stop layer ESL3. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2. The metal layer MT2 is embedded in the interlayer dielectric layer ILD22.

The barrier layer BR22' and the liner layer LN22 are disposed between the interlayer dielectric layer ILD22 and the metal layer MT2, and between the interlayer dielectric layer ILD21 and the metal layer MT2. Only the liner layer LN22 is disposed between the metal layer MT2 and the self-forming metal capping layer CP2. The barrier layer BR22' is not disposed between the metal layer MT2 and the self-forming metal capping layer CP2.

In the embodiment shown in the FIG. 11, the self-forming metal capping layer CP1 is self-formed on the metal layer MT1 without any selective deposition process. Therefore, any metallic residue would not be formed on the interface between the interlayer dielectric layer ILD1 and the etching stop bi-layer structure ESBS1. The self-forming metal capping layer CP2 is self-formed on the via VA without any selective deposition process. Therefore, any metallic residue would not be formed on the interface between the interlayer dielectric layer ILD21 and the etching stop bi-layer structure ESBS2. The selectivity loss issue which caused by conventional metal-on-metal (MoM) selective deposition process for the metal cap would be avoided.

Figure 12:
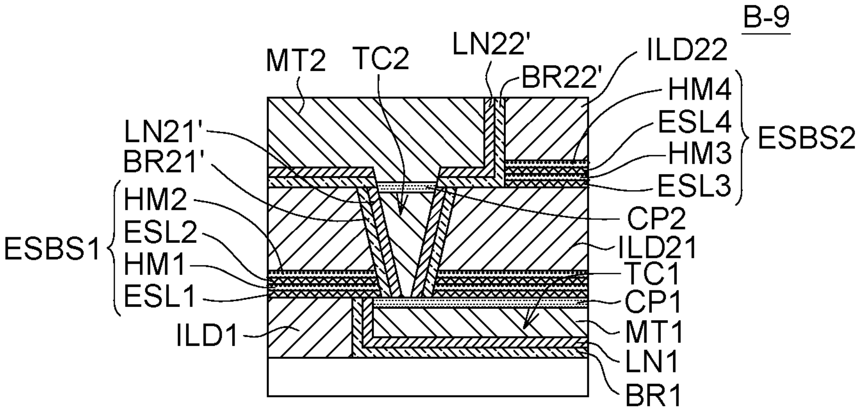
FIG. 12 shows a semiconductor structure B-9 according to another embodiment.

Please refer to FIG. 12, which shows a semiconductor structure B-9 according to another embodiment. The semiconductor structure B-9 is an interconnection for two metal layers MT1, MT2 with single damascene in the back-end-of-line (BEOL) process. The semiconductor structure B-9 includes, for example, the interlayer dielectric (ILD) layer ILD1, the barrier layer BR1, the liner layer LN1, the metal layer MT1, the self-forming metal capping layer CP1, the etching stop bi-layer structure ESBS1, an interlayer dielectric layer ILD21, the barrier layer BR21', the liner layer LN21', the via VA, the self-forming metal capping layer CP2, the etching stop bi-layer structure ESBS2, the interlayer dielectric layer ILD22, the barrier layer BR22', the liner layer LN22' and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The self-forming metal capping layer CP1 is disposed on the metal layer MT1. The self-forming metal capping layer CP1 only covers the metal layer MT1 and does not cover the interlayer dielectric layer ILD1. In this embodiment, the self-forming metal capping layer CP1 is formed through the thermal treatment, the photo treatment or the bias-assist treatment on the metal conductor with metal dopants. The metal conductor with the metal dopants is filled in the trench TC1. After the thermal treatment, the photo treatment or the bias-assist treatment, the dopants will be gathered at the top of the metal conductor to form the metal layer MT1 and the self-forming metal capping layer CP1 disposed thereon.

The etching stop bi-layer structure ESBS1 includes, for example, the conformal etching stop layer ESL1, the hermetic layer HM1, the conformal etching stop layer ESL2, and the hermetic layer HM2. The conformal etching stop layer ESL1 is disposed on the interlayer dielectric layer ILD1 and the self-forming metal capping layer CP1. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2.

The interlayer dielectric layer ILD21 is disposed on the etching stop bi-layer structure ESBS1. The via VA is embedded in the interlayer dielectric layer ILD21.

The barrier layer BR21' and the liner layer LN21' are disposed between the interlayer dielectric layer ILD21 and the via VA. The via VA is directly connected to the self-forming metal layer CP1. The barrier layer BR21' and the liner layer LN21' are not disposed between the via VA and the self-forming metal capping layer CP1.

The self-forming metal capping layer CP2 is disposed on the via VA. The self-forming metal capping layer CP2 only covers the via VA and does not cover the interlayer dielectric layer ILD21. In this embodiment, the self-forming metal capping layer CP2 is formed through the thermal treatment, the photo treatment or the bias-assist treatment on the metal conductor with metal dopants. The metal conductor with the metal dopants is filled in the trench TC2. After the thermal treatment, the photo treatment or the bias-assist treatment, the dopants will be gathered at the top of the metal conductor to form the via VA and the self-forming metal capping layer CP2 disposed thereon.

The etching stop bi-layer structure ESBS2 includes, for example, the conformal etching stop layer ESL3, the hermetic layer HM3, the conformal etching stop layer ESL4, and the hermetic layer HM4. The conformal etching stop layer ESL3 is disposed on the interlayer dielectric layer ILD21. The hermetic layer HM3 is disposed on the conformal etching stop layer ESL3. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2. The metal layer MT2 is embedded in the interlayer dielectric layer ILD22.

The barrier layer BR22' and the liner layer LN22' are disposed between the interlayer dielectric layer ILD22 and the metal layer MT2, and between the interlayer dielectric layer ILD21 and the metal layer MT2. The metal layer MT2 is directly connected to the self-forming metal capping layer CP2. The barrier layer BR22' and the liner layer LN22' are not disposed between the metal layer MT2 and the self-forming metal capping layer CP2.

In the embodiment shown in the FIG. 12, the self-forming metal capping layer CP1 is self-formed on the metal layer MT1 without any selective deposition process. Therefore, any metallic residue would not be formed on the interface between the interlayer dielectric layer ILD1 and the etching stop bi-layer structure ESBS1. The self-forming metal capping layer CP2 is self-formed on the via VA without any selective deposition process. Therefore, any metallic residue would not be formed on the interface between the interlayer dielectric layer ILD21 and the etching stop bi-layer structure ESBS2. The selectivity loss issue which caused by conventional metal-on-metal (MoM) selective deposition process for the metal cap would be avoided.

Figure 13:
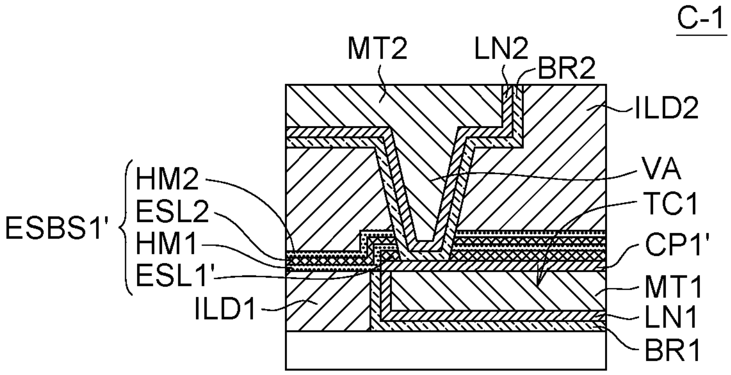
FIG. 13 shows a semiconductor structure C-1 according to one embodiment.

Please refer to FIG. 13, which shows a semiconductor structure C-1 according to one embodiment. The semiconductor structure C-1 is an interconnection for two metal layers MT1, MT2 with dual damascene in the back-end-of-line (BEOL) process. The semiconductor structure C-1 includes, for example, the interlayer dielectric (ILD) layer ILD1, the barrier layer BR1, the liner layer LN1, the metal layer MT1, a metal capping layer CP1', an etching stop bi-layer structure ESBS1', the interlayer dielectric layer ILD2, the barrier layer BR2, the liner layer LN2, the via VA and the metal layer MT2.

The metal layer MT1 is embedded in the interlayer dielectric layer ILD1.

The barrier layer BR1 and the liner layer LN1 are disposed between the metal layer MT1 and the interlayer dielectric layer ILD1.

The metal capping layer CP1' is disposed on the metal layer MT1. The metal capping layer CP1' only covers the metal layer MT1 and does not cover the interlayer dielectric layer ILD1. The material of the metal capping layer CP1' is, for example, cobalt (Co), graphene, nickel (Ni), tin (SN), tin-lead (Sn—Pb), gold (Au), copper (Cu), silver (Ag), palladium (Pd), indium (In), nickel-palladium-gold (Ni—Pd—Au), nickel-gold (Ni—Au), the like, or a combination thereof. In this embodiment, the metal capping layer CP1 may be formed through the selective deposition.

The etching stop bi-layer structure ESBS1' includes, for example, a self-aligned etching stop layer ESL1', the hermetic layer HM1, the conformal etching stop layer ESL2, and the hermetic layer HM2. The self-aligned etching stop layer ESL1' is disposed on the interlayer dielectric layer ILD1 and the metal capping layer CP1'. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2. A thickness of the self-aligned etching stop layer ESL1' is 1 Å to 100 μm. The material of the self-aligned etching stop layer ESL1' is Zirconium oxide (ZrO2) or Aluminum oxide. In this embodiment, the self-aligned etching stop layer ESL1' is formed through a thermal treatment, a photo treatment or a bias-assist treatment on a metal conductor with metal dopants. The metal conductor with the metal dopants is filled in the trench TC1. After the thermal treatment, the photo treatment or the bias-assist treatment, the dopants will be gathered at the top of the metal capping layer CP1' to form the metal layer MT1 and the self-aligned etching stop layer ESL1' disposed on the metal capping layer CP1'.

The interlayer dielectric layer ILD2 is disposed on the etching stop bi-layer structure ESBS1'. The via VA and the metal layer MT2 are embedded in the interlayer dielectric layer ILD2.

The barrier layer BR2 and the liner layer LN2 are disposed between the interlayer dielectric layer ILD2 and the via VA, between the interlayer dielectric layer ILD2 and the metal layer MT2, and between the via VA and the metal capping layer CP1'.

In the embodiment shown in the FIG. 13, the self-aligned etching stop layer ESL1' is self-formed on the metal capping layer CP1' without any selective deposition process. Therefore, the self-aligned etching stop layer ESL1' is only disposed on the metal capping layer CP1'. The parasitic capacitance of the interconnection can be effectively decreased due to the reduction of the high-k material used for the self-aligned etching stop layer ESL1'.

Figure 14:
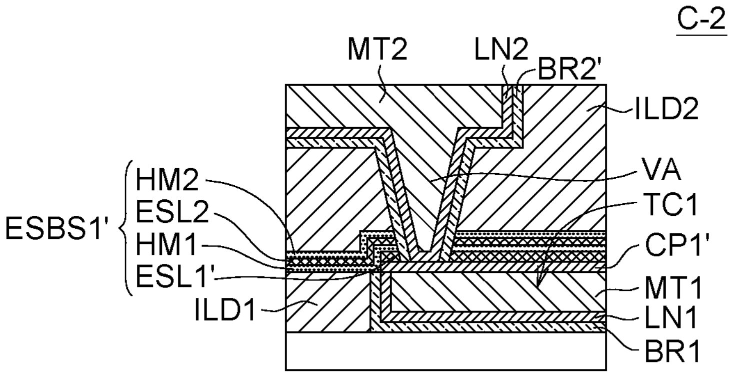
FIG. 14 shows a semiconductor structure C-2 according to one embodiment.

Please refer to FIG. 14, which shows a semiconductor structure C-2 according to one embodiment. The semiconductor structure C-2 is an interconnection for two metal layers MT1, MT2 with dual damascene in the back-end-of-line (BEOL) process. The semiconductor structure C-2 includes, for example, the interlayer dielectric (ILD) layer ILD1, the barrier layer BR1, the liner layer LN1, the metal layer MT1, the metal capping layer CP1', the etching stop bi-layer structure ESBS1', the interlayer dielectric layer ILD2, the barrier layer BR2', the liner layer LN2, the via VA and the metal layer MT2.

The metal layer MT1 is embedded in the interlayer dielectric layer ILD1.

The barrier layer BR1 and the liner layer LN1 are disposed between the metal layer MT1 and the interlayer dielectric layer ILD1.

The metal capping layer CP1' is disposed on the metal layer MT1. The metal capping layer CP1' only covers the metal layer MT1 and does not cover the interlayer dielectric layer ILD1. In this embodiment, the metal capping layer CP1' may be formed through the selective deposition.

The etching stop bi-layer structure ESBS1' includes, for example, the self-aligned etching stop layer ESL1', the hermetic layer HM1, the conformal etching stop layer ESL2, and the hermetic layer HM2. The self-aligned etching stop layer ESL1' is disposed on the interlayer dielectric layer ILD1 and the metal capping layer CP1'. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2. In this embodiment, the self-aligned etching stop layer ESL1' is formed through a thermal treatment, a photo treatment or a bias-assist treatment on a metal conductor with metal dopants. The metal conductor with the metal dopants is filled in the trench TC1. After the thermal treatment, the photo treatment or the bias-assist treatment, the dopants will be gathered at the top of the metal capping layer CP1' to form the metal layer MT1 and the self-aligned etching stop layer ESL1' disposed on the metal capping layer CP1'.

The interlayer dielectric layer ILD2 is disposed on the etching stop bi-layer structure ESBS1'. The via VA and the metal layer MT2 are embedded in the interlayer dielectric layer ILD2.

The barrier layer BR2' and the liner layer LN2 are disposed between the interlayer dielectric layer ILD2 and the via VA, between the interlayer dielectric layer ILD2 and the metal layer MT2, and between the via VA and the metal capping layer CP1'.

In the embodiment shown in the FIG. 14, the self-aligned etching stop layer ESL1' is self-formed on the metal capping layer CP1' without any selective deposition process. Therefore, the self-aligned etching stop layer ESL1' is only disposed on the metal capping layer CP1'. The parasitic capacitance of the interconnection can be effectively decreased due to the reduction of the high-k material used for the self-aligned etching stop layer ESL1'.

Figure 15:
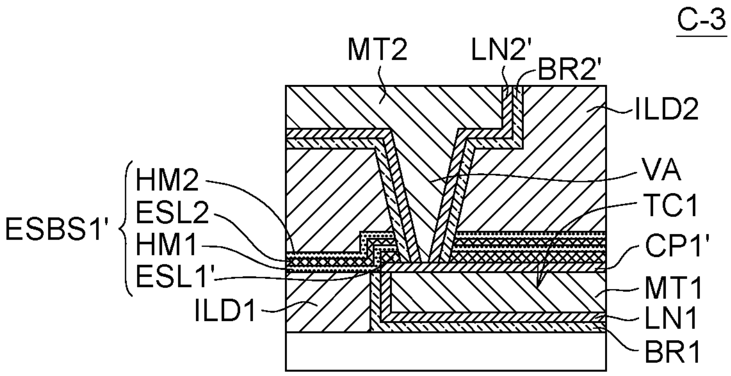
FIG. 15 shows a semiconductor structure C-3 according to one embodiment.

Please refer to FIG. 15, which shows a semiconductor structure C-3 according to one embodiment. The semiconductor structure C-3 is an interconnection for two metal layers MT1, MT2 with dual damascene in the back-end-of-line (BEOL) process. The semiconductor structure C-3 includes, for example, the interlayer dielectric (ILD) layer ILD1, the barrier layer BR1, the liner layer LN1, the metal layer MT1, the metal capping layer CP1', the etching stop bi-layer structure ESBS1', the interlayer dielectric layer ILD2, the barrier layer BR2', the liner layer LN2', the via VA and the metal layer MT2.

The metal layer MT1 is embedded in the interlayer dielectric layer ILD1.

The barrier layer BR1 and the liner layer LN1 are disposed between the metal layer MT1 and the interlayer dielectric layer ILD1.

The metal capping layer CP1' is disposed on the metal layer MT1. The metal capping layer CP1' only covers the metal layer MT1 and does not cover the interlayer dielectric layer ILD1. In this embodiment, the metal capping layer CP1' may be formed through the selective deposition.

The etching stop bi-layer structure ESBS1' includes, for example, the self-aligned etching stop layer ESL1', the hermetic layer HM1, the conformal etching stop layer ESL2, and the hermetic layer HM2. The self-aligned etching stop layer ESL1' is disposed on the interlayer dielectric layer ILD1 and the metal capping layer CP1'. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2. In this embodiment, the self-aligned etching stop layer ESL1' is formed through a thermal treatment, a photo treatment or a bias-assist treatment on a metal conductor with metal dopants. The metal conductor with the metal dopants is filled in the trench TC1. After the thermal treatment, the photo treatment or the bias-assist treatment, the dopants will be gathered at the top of the metal capping layer CP1' to form the metal layer MT1 and the self-aligned etching stop layer ESL1' disposed on the metal capping layer CP1'.

The interlayer dielectric layer ILD2 is disposed on the etching stop bi-layer structure ESBS1'. The via VA and the metal layer MT2 are embedded in the interlayer dielectric layer ILD2.

The barrier layer BR2' and the liner layer LN2' are disposed between the interlayer dielectric layer ILD2 and the via VA, and between the interlayer dielectric layer ILD2 and the metal layer MT2. The metal layer MT2 is directly connected to the via VA. The barrier layer BR2 and the liner layer LN2' are not disposed between the via VA and the metal capping layer CP1'.

In the embodiment shown in the FIG. 15, the self-aligned etching stop layer ESL1' is self-formed on the metal capping layer CP1' without any selective deposition process. Therefore, the self-aligned etching stop layer ESL1' is only disposed on the metal capping layer CP1'. The parasitic capacitance of the interconnection can be effectively decreased due to the reduction of the high-k material used for the self-aligned etching stop layer ESL1'.

Figure 16:
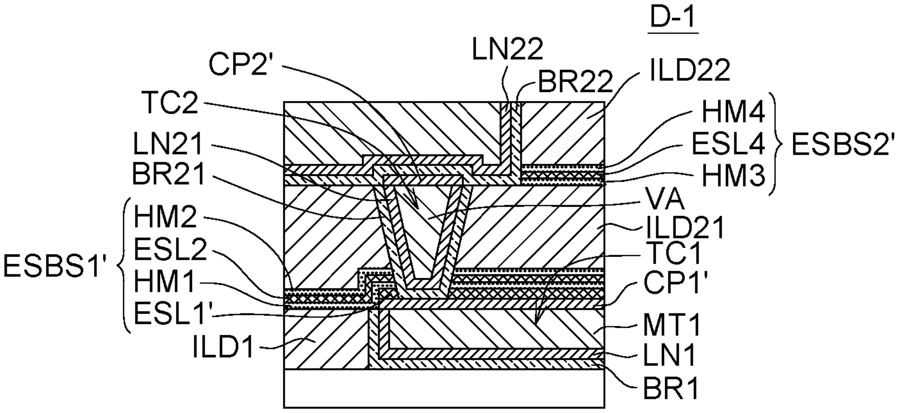
FIG. 16 shows a semiconductor structure D-1 according to another embodiment.

Please refer to FIG. 16, which shows a semiconductor structure D-1 according to another embodiment. The semiconductor structure D-1 is an interconnection for two metal layers MT1, MT2 with single damascene in the back-end-of-line (BEOL) process. The semiconductor structure D-1 includes, for example, the interlayer dielectric (ILD) layer ILD1, the barrier layer BR1, the liner layer LN1, the metal layer MT1, the metal capping layer CP1', the etching stop bi-layer structure ESBS1', the interlayer dielectric layer ILD21, the barrier layer BR21, the liner layer LN21, the via VA, a metal capping layer CP2', an etching stop bi-layer structure ESBS2', the interlayer dielectric layer ILD22, the barrier layer BR22, the liner layer LN22 and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The metal capping layer CP1' is disposed on the metal layer MT1. The metal capping layer CP1' only covers the metal layer MT1 and does not cover the interlayer dielectric layer ILD1. In this embodiment, the metal capping layer CP1' may be formed through the selective deposition.

The etching stop bi-layer structure ESBS1' includes, for example, the self-aligned etching stop layer ESL1', the hermetic layer HM1, the conformal etching stop layer ESL2, and the hermetic layer HM2. The self-aligned etching stop layer ESL1' is disposed on the interlayer dielectric layer ILD1 and the metal capping layer CP1'. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2. In this embodiment, the self-aligned etching stop layer ESL1' is formed through a thermal treatment, a photo treatment or a bias-assist treatment on a metal conductor with metal dopants. The metal conductor with the metal dopants is filled in the trench TC1. After the thermal treatment, the photo treatment or the bias-assist treatment, the dopants will be gathered at the top of the metal capping layer CP1' to form the metal layer MT1 and the self-aligned etching stop layer ESL1' disposed on the metal capping layer CP1'.

The interlayer dielectric layer ILD21 is disposed on the etching stop bi-layer structure ESBS1'. The via VA is embedded in the interlayer dielectric layer ILD21'.

The barrier layer BR21 and the liner layer LN21 are disposed between the interlayer dielectric layer ILD21 and the via VA, and between the via VA and the metal capping layer CP1'.

The metal capping layer CP2' is disposed on the via VA. The metal capping layer CP2' only covers the via VA and does not cover the interlayer dielectric layer ILD21. In this embodiment, the metal capping layer CP2' may be formed through the selective deposition.

The etching stop bi-layer structure ESBS2' includes, for example, the hermetic layer HM3, the conformal etching stop layer ESL4, and the hermetic layer HM4. A self-aligned etching stop layer ESL3' (shown in FIG. 33G) formed on the via VA only is removed. The hermetic layer HM3 is disposed on the interlayer dielectric layer ILD21. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2'. The metal layer MT2 is embedded in the interlayer dielectric layer ILD22.

The barrier layer BR22 and the liner layer LN22 are disposed between the interlayer dielectric layer ILD22 and the metal layer MT2, between the interlayer dielectric layer ILD21 and the metal layer MT2, and between the metal capping layer CP2' and the metal layer MT2.

In the embodiment shown in the FIG. 16, the self-aligned etching stop layer ESL1' is self-formed on the metal capping layer CP1' without any selective deposition process, so the self-aligned etching stop layer ESL1' is only disposed on the metal capping layer CP1'. The self-aligned etching stop layer ESL3' (shown in FIG. 33G) formed on the via VA only is removed, so the there is no self-aligned etching stop layer ESL3' (shown in FIG. 33G) in the semiconductor structure D-1. The parasitic capacitance of the interconnection can be effectively decreased due to the reduction of the high-k material used for the self-aligned etching stop layer ESL1' or the self-aligned etching stop layer ESL3' (shown in FIG. 33G).

Figure 17:
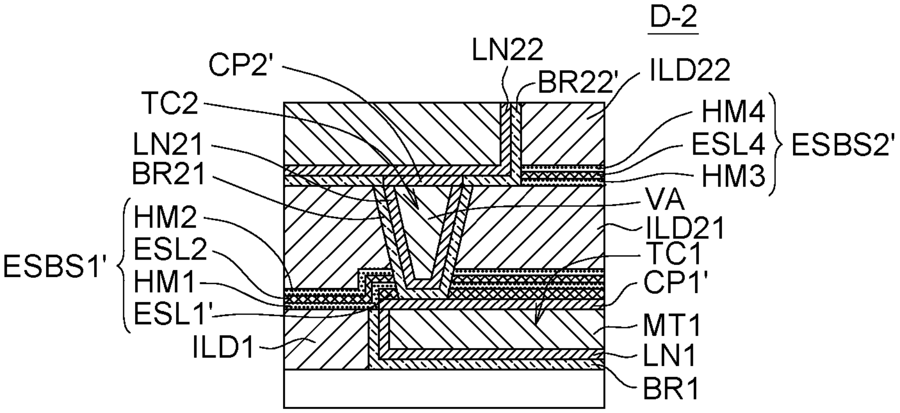
FIG. 17 shows a semiconductor structure D-2 according to another embodiment.

Please refer to FIG. 17, which shows a semiconductor structure D-2 according to another embodiment. The semiconductor structure D-2 is an interconnection for two metal layers MT1, MT2 with single damascene in the back-end-of-line (BEOL) process. The semiconductor structure D-2 includes, for example, the interlayer dielectric (ILD) layer ILD1, the barrier layer BR1, the liner layer LN1, the metal layer MT1, the metal capping layer CP1', the etching stop bi-layer structure ESBS1', the interlayer dielectric layer ILD21, the barrier layer BR21, the liner layer LN21, the via VA, the metal capping layer CP2', the etching stop bi-layer structure ESBS2', the interlayer dielectric layer ILD22, the barrier layer BR22', the liner layer LN22 and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The metal capping layer CP1' is disposed on the metal layer MT1. The metal capping layer CP1' only covers the metal layer MT1 and does not cover the interlayer dielectric layer ILD1. In this embodiment, the metal capping layer CP1' may be formed through the selective deposition.

The etching stop bi-layer structure ESBS1' includes, for example, the self-aligned etching stop layer ESL1', the hermetic layer HM1, the conformal etching stop layer ESL2, and the hermetic layer HM2. The self-aligned etching stop layer ESL1' is disposed on the interlayer dielectric layer ILD1 and the metal capping layer CP1'. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2. In this embodiment, the self-aligned etching stop layer ESL1' is formed through a thermal treatment, a photo treatment or a bias-assist treatment on a metal conductor with metal dopants. The metal conductor with the metal dopants is filled in the trench TC1. After the thermal treatment, the photo treatment or the bias-assist treatment, the dopants will be gathered at the top of the metal capping layer CP1' to form the metal layer MT1 and the self-aligned etching stop layer ESL1' disposed on the metal capping layer CP1'.

The interlayer dielectric layer ILD21 is disposed on the etching stop bi-layer structure ESBS1'. The via VA is embedded in the interlayer dielectric layer ILD21'.

The barrier layer BR21 and the liner layer LN21 are disposed between the interlayer dielectric layer ILD21 and the via VA, and between the via VA and the metal capping layer CP1'.

The metal capping layer CP2' is disposed on the via VA. The metal capping layer CP2' only covers the via VA and does not cover the interlayer dielectric layer ILD21. In this embodiment, the metal capping layer CP2' may be formed through the selective deposition.

The etching stop bi-layer structure ESBS2' includes, for example, the hermetic layer HM3, the conformal etching stop layer ESL4, and the hermetic layer HM4. A self-aligned etching stop layer ESL3' (shown in FIG. 33G) formed on the via VA only is removed. The hermetic layer HM3 is disposed on the interlayer dielectric layer ILD21. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2'. The metal layer MT2 is embedded in the interlayer dielectric layer ILD22.

The barrier layer BR22' and the liner layer LN22 are disposed between the interlayer dielectric layer ILD22 and the metal layer MT2, and between the interlayer dielectric layer ILD21 and the metal layer MT2. Only the liner layer LN22 is disposed between the metal capping layer CP2' and the metal layer MT2. The barrier layer BR22' is not disposed between the metal capping layer CP2' and the metal layer MT2.

In the embodiment shown in the FIG. 17, the self-aligned etching stop layer ESL1' is self-formed on the metal capping layer CP1' without any selective deposition process, so the self-aligned etching stop layer ESL1' is only disposed on the metal capping layer CP1'. The self-aligned etching stop layer ESL3' (shown in FIG. 33G) formed on the via VA only is removed, so the there is no self-aligned etching stop layer ESL3' (shown in FIG. 33G) in the semiconductor structure D-2. The parasitic capacitance of the interconnection can be effectively decreased due to the reduction of the high-k material used for the self-aligned etching stop layer ESL1' or the self-aligned etching stop layer ESL3' (shown in FIG. 33G).

Figure 18:
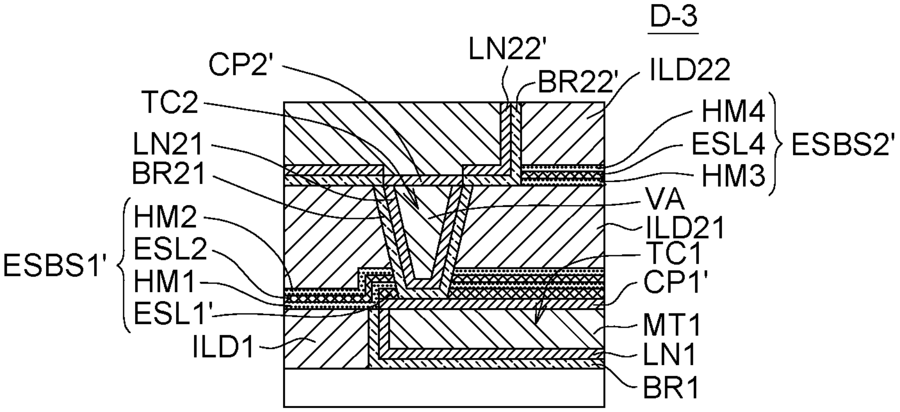
FIG. 18 shows a semiconductor structure D-3 according to another embodiment.

Please refer to FIG. 18, which shows a semiconductor structure D-3 according to another embodiment. The semiconductor structure D-3 is an interconnection for two metal layers MT1, MT2 with single damascene in the back-end-of-line (BEOL) process. The semiconductor structure D-3 includes, for example, the interlayer dielectric (ILD) layer ILD1, the barrier layer BR1, the liner layer LN1, the metal layer MT1, the metal capping layer CP1', the etching stop bi-layer structure ESBS1', the interlayer dielectric layer ILD21, the barrier layer BR21, the liner layer LN21, the via VA, the metal capping layer CP2', the etching stop bi-layer structure ESBS2', the interlayer dielectric layer ILD22, the barrier layer BR22', the liner layer LN22' and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The metal capping layer CP1' is disposed on the metal layer MT1. The metal capping layer CP1' only covers the metal layer MT1 and does not cover the interlayer dielectric layer ILD1. In this embodiment, the metal capping layer CP1' may be formed through the selective deposition.

The etching stop bi-layer structure ESBS1' includes, for example, the self-aligned etching stop layer ESL1', the hermetic layer HM1, the conformal etching stop layer ESL2, and the hermetic layer HM2. The self-aligned etching stop layer ESL1' is disposed on the interlayer dielectric layer ILD1 and the metal capping layer CP1'. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2. In this embodiment, the self-aligned etching stop layer ESL1' is formed through a thermal treatment, a photo treatment or a bias-assist treatment on a metal conductor with metal dopants. The metal conductor with the metal dopants is filled in the trench TC1. After the thermal treatment, the photo treatment or the bias-assist treatment, the dopants will be gathered at the top of the metal capping layer CP1' to form the metal layer MT1 and the self-aligned etching stop layer ESL1' disposed on the metal capping layer CP1'.

The interlayer dielectric layer ILD21 is disposed on the etching stop bi-layer structure ESBS1'. The via VA is embedded in the interlayer dielectric layer ILD21'.

The barrier layer BR21 and the liner layer LN21 are disposed between the interlayer dielectric layer ILD21 and the via VA, and between the via VA and the metal capping layer CP1'.

The metal capping layer CP2' is disposed on the via VA. The metal capping layer CP2' only covers the via VA and does not cover the interlayer dielectric layer ILD21. In this embodiment, the metal capping layer CP2' may be formed through the selective deposition.

The etching stop bi-layer structure ESBS2' includes, for example, the hermetic layer HM3, the conformal etching stop layer ESL4, and the hermetic layer HM4. A self-aligned etching stop layer ESL3' (shown in FIG. 33G) formed on the via VA only is removed. The hermetic layer HM3 is disposed on the interlayer dielectric layer ILD21. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2'. The metal layer MT2 is embedded in the interlayer dielectric layer ILD22.

The barrier layer BR22' and the liner layer LN22' are disposed between the interlayer dielectric layer ILD22 and the metal layer MT2, and between the interlayer dielectric layer ILD21 and the metal layer MT2. The metal layer MT2 is directly connected to the metal capping layer CP2'. The barrier layer BR22' and the liner layer LN22 are not disposed between the metal capping layer CP2' and the metal layer MT2.

In the embodiment shown in the FIG. 18, the self-aligned etching stop layer ESL1' is self-formed on the metal capping layer CP1' without any selective deposition process, so the self-aligned etching stop layer ESL1' is only disposed on the metal capping layer CP1'. The self-aligned etching stop layer ESL3' (shown in FIG. 33G) formed on the via VA only is removed, so the there is no self-aligned etching stop layer ESL3' (shown in FIG. 33G) in the semiconductor structure D-3. The parasitic capacitance of the interconnection can be effectively decreased due to the reduction of the high-k material used for the self-aligned etching stop layer ESL1' or the self-aligned etching stop layer ESL3' (shown in FIG. 33G).

Figure 19:
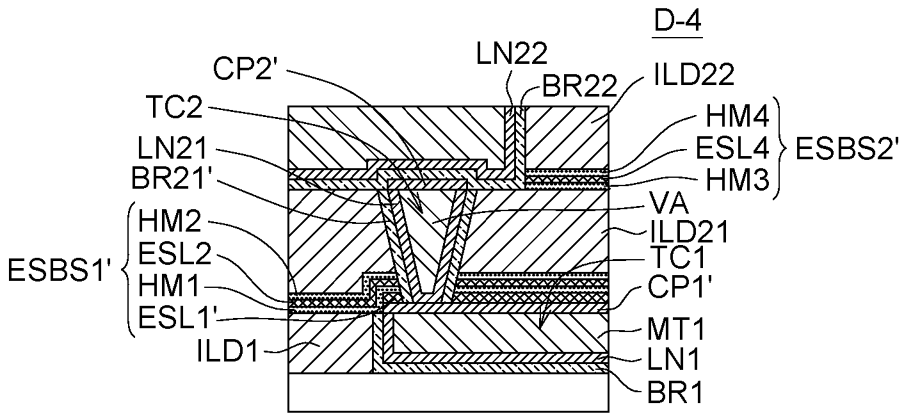
FIG. 19 shows a semiconductor structure D-4 according to another embodiment.

Please refer to FIG. 19, which shows a semiconductor structure D-4 according to another embodiment. The semiconductor structure D-4 is an interconnection for two metal layers MT1, MT2 with single damascene in the back-end-of-line (BEOL) process. The semiconductor structure D-4 includes, for example, the interlayer dielectric (ILD) layer ILD1, the barrier layer BR1, the liner layer LN1, the metal layer MT1, the metal capping layer CP1', the etching stop bi-layer structure ESBS1', the interlayer dielectric layer ILD21, the barrier layer BR21', the liner layer LN21, the via VA, a metal capping layer CP2', an etching stop bi-layer structure ESBS2', the interlayer dielectric layer ILD22, the barrier layer BR22, the liner layer LN22 and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The metal capping layer CP1' is disposed on the metal layer MT1. The metal capping layer CP1' only covers the metal layer MT1 and does not cover the interlayer dielectric layer ILD1. In this embodiment, the metal capping layer CP1' may be formed through the selective deposition.

The etching stop bi-layer structure ESBS1' includes, for example, the self-aligned etching stop layer ESL1', the hermetic layer HM1, the conformal etching stop layer ESL2, and the hermetic layer HM2. The self-aligned etching stop layer ESL1' is disposed on the interlayer dielectric layer ILD1 and the metal capping layer CP1'. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2. In this embodiment, the self-aligned etching stop layer ESL1' is formed through a thermal treatment, a photo treatment or a bias-assist treatment on a metal conductor with metal dopants. The metal conductor with the metal dopants is filled in the trench TC1. After the thermal treatment, the photo treatment or the bias-assist treatment, the dopants will be gathered at the top of the metal capping layer CP1' to form the metal layer MT1 and the self-aligned etching stop layer ESL1' disposed on the metal capping layer CP1'.

The interlayer dielectric layer ILD21 is disposed on the etching stop bi-layer structure ESBS1'. The via VA is embedded in the interlayer dielectric layer ILD21'.

The barrier layer BR21' and the liner layer LN21 are disposed between the interlayer dielectric layer ILD21 and the via VA. Only the liner layer LN21 is disposed between the via VA and the metal capping layer CP1'. The barrier layer BR21' is not disposed between the via VA and the metal capping layer CP1'.

The metal capping layer CP2' is disposed on the via VA. The metal capping layer CP2' only covers the via VA and does not cover the interlayer dielectric layer ILD21. In this embodiment, the metal capping layer CP2' may be formed through the selective deposition.

The etching stop bi-layer structure ESBS2' includes, for example, the hermetic layer HM3, the conformal etching stop layer ESL4, and the hermetic layer HM4. A self-aligned etching stop layer ESL3' (shown in FIG. 33G) formed on the via VA only is removed. The hermetic layer HM3 is disposed on the interlayer dielectric layer ILD21. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2'. The metal layer MT2 is embedded in the interlayer dielectric layer ILD22.

The barrier layer BR22 and the liner layer LN22 are disposed between the interlayer dielectric layer ILD22 and the metal layer MT2, between the interlayer dielectric layer ILD21 and the metal layer MT2, and between the metal capping layer CP2' and the metal layer MT2.

In the embodiment shown in the FIG. 19, the self-aligned etching stop layer ESL1' is self-formed on the metal capping layer CP1' without any selective deposition process, so the self-aligned etching stop layer ESL' is only disposed on the metal capping layer CP1'. The self-aligned etching stop layer ESL3' (shown in FIG. 33G) formed on the via VA only is removed, so the there is no self-aligned etching stop layer ESL3' (shown in FIG. 33G) in the semiconductor structure D-4. The parasitic capacitance of the interconnection can be effectively decreased due to the reduction of the high-k material used for the self-aligned etching stop layer ESL1' or the self-aligned etching stop layer ESL3' (shown in FIG. 33G).

Figure 20:
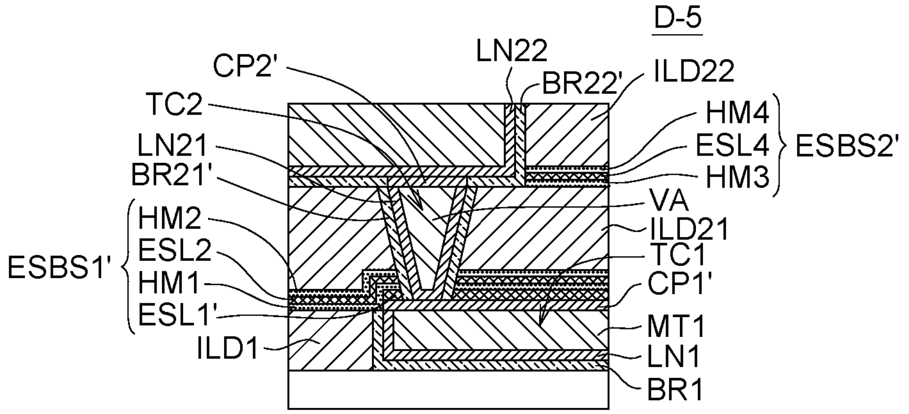
FIG. 20 shows a semiconductor structure D-5 according to another embodiment.

Please refer to FIG. 20, which shows a semiconductor structure D-5 according to another embodiment. The semiconductor structure D-5 is an interconnection for two metal layers MT1, MT2 with single damascene in the back-end-of-line (BEOL) process. The semiconductor structure D-5 includes, for example, the interlayer dielectric (ILD) layer ILD1, the barrier layer BR1, the liner layer LN1, the metal layer MT1, the metal capping layer CP1', the etching stop bi-layer structure ESBS1', the interlayer dielectric layer ILD21, the barrier layer BR21', the liner layer LN21, the via VA, a metal capping layer CP2', an etching stop bi-layer structure ESBS2', the interlayer dielectric layer ILD22, the barrier layer BR22', the liner layer LN22 and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The metal capping layer CP1' is disposed on the metal layer MT1. The metal capping layer CP1' only covers the metal layer MT1 and does not cover the interlayer dielectric layer ILD1. In this embodiment, the metal capping layer CP1' may be formed through the selective deposition.

The etching stop bi-layer structure ESBS1' includes, for example, the self-aligned etching stop layer ESL1', the hermetic layer HM1, the conformal etching stop layer ESL2, and the hermetic layer HM2. The self-aligned etching stop layer ESL1' is disposed on the interlayer dielectric layer ILD1 and the metal capping layer CP1'. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2. In this embodiment, the self-aligned etching stop layer ESL1' is formed through a thermal treatment, a photo treatment or a bias-assist treatment on a metal conductor with metal dopants. The metal conductor with the metal dopants is filled in the trench TC1. After the thermal treatment, the photo treatment or the bias-assist treatment, the dopants will be gathered at the top of the metal capping layer CP1' to form the metal layer MT1 and the self-aligned etching stop layer ESL1' disposed on the metal capping layer CP1'.

The interlayer dielectric layer ILD21 is disposed on the etching stop bi-layer structure ESBS1'. The via VA is embedded in the interlayer dielectric layer ILD21'.

The barrier layer BR21' and the liner layer LN21 are disposed between the interlayer dielectric layer ILD21 and the via VA. Only the liner layer LN21 is disposed between the via VA and the metal capping layer CP1'. The barrier layer BR21' is not disposed between the via VA and the metal capping layer CP1'.

The metal capping layer CP2' is disposed on the via VA. The metal capping layer CP2' only covers the via VA and does not cover the interlayer dielectric layer ILD21. In this embodiment, the metal capping layer CP2' may be formed through the selective deposition.

The etching stop bi-layer structure ESBS2' includes, for example, the hermetic layer HM3, the conformal etching stop layer ESL4, and the hermetic layer HM4. A self-aligned etching stop layer ESL3' (shown in FIG. 33G) formed on the via VA only is removed. The hermetic layer HM3 is disposed on the interlayer dielectric layer ILD21. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2'. The metal layer MT2 is embedded in the interlayer dielectric layer ILD22.

The barrier layer BR22' and the liner layer LN22 are disposed between the interlayer dielectric layer ILD22 and the metal layer MT2, between the interlayer dielectric layer ILD21 and the metal layer MT2. Only the liner layer LN22 is disposed between the metal capping layer CP2' and the metal layer MT2. The barrier layer BR22' is not disposed between the metal capping layer CP2' and the metal MT2.

In the embodiment shown in the FIG. 20, the self-aligned etching stop layer ESL1' is self-formed on the metal capping layer CP1' without any selective deposition process, so the self-aligned etching stop layer ESL1' is only disposed on the metal capping layer CP1'. The self-aligned etching stop layer ESL3' (shown in FIG. 33G) formed on the via VA only is removed, so the there is no self-aligned etching stop layer ESL3' (shown in FIG. 33G) in the semiconductor structure D-5. The parasitic capacitance of the interconnection can be effectively decreased due to the reduction of the high-k material used for the self-aligned etching stop layer ESL1' or the self-aligned etching stop layer ESL3' (shown in FIG. 33G).

Figure 21:
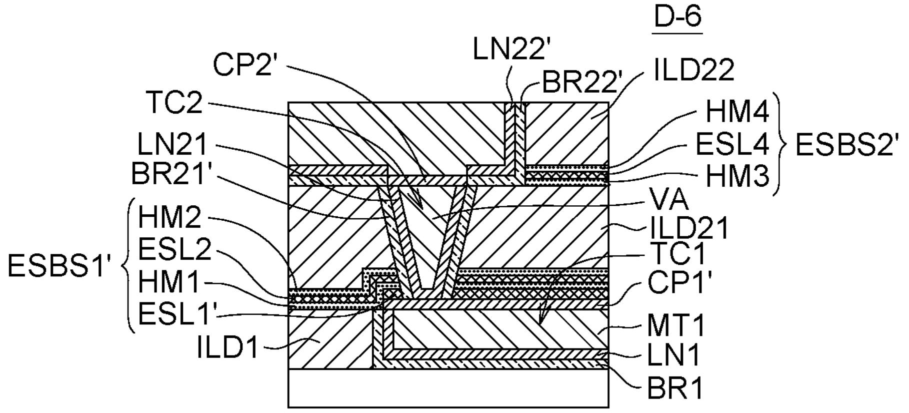
FIG. 21 shows a semiconductor structure D-6 according to another embodiment.

Please refer to FIG. 21, which shows a semiconductor structure D-6 according to another embodiment. The semiconductor structure D-6 is an interconnection for two metal layers MT1, MT2 with single damascene in the back-end-of-line (BEOL) process. The semiconductor structure D-6 includes, for example, the interlayer dielectric (ILD) layer ILD1, the barrier layer BR1, the liner layer LN1, the metal layer MT1, the metal capping layer CP1', the etching stop bi-layer structure ESBS1', the interlayer dielectric layer ILD21, the barrier layer BR21', the liner layer LN21, the via VA, a metal capping layer CP2', an etching stop bi-layer structure ESBS2', the interlayer dielectric layer ILD22, the barrier layer BR22', the liner layer LN22' and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The metal capping layer CP1' is disposed on the metal layer MT1. The metal capping layer CP1' only covers the metal layer MT1 and does not cover the interlayer dielectric layer ILD1. In this embodiment, the metal capping layer CP1' may be formed through the selective deposition.

The etching stop bi-layer structure ESBS1' includes, for example, the self-aligned etching stop layer ESL1', the hermetic layer HM1, the conformal etching stop layer ESL2, and the hermetic layer HM2. The self-aligned etching stop layer ESL1' is disposed on the interlayer dielectric layer ILD1 and the metal capping layer CP1'. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2. In this embodiment, the self-aligned etching stop layer ESL1' is formed through a thermal treatment, a photo treatment or a bias-assist treatment on a metal conductor with metal dopants. The metal conductor with the metal dopants is filled in the trench TC1. After the thermal treatment, the photo treatment or the bias-assist treatment, the dopants will be gathered at the top of the metal capping layer CP1' to form the metal layer MT1 and the self-aligned etching stop layer ESL1' disposed on the metal capping layer CP1'.

The interlayer dielectric layer ILD21 is disposed on the etching stop bi-layer structure ESBS1'. The via VA is embedded in the interlayer dielectric layer ILD21'.

The barrier layer BR21' and the liner layer LN21 are disposed between the interlayer dielectric layer ILD21 and the via VA. Only the liner layer LN21 is disposed between the via VA and the metal capping layer CP1'. The barrier layer BR21' is not disposed between the via VA and the metal capping layer CP1'.

The metal capping layer CP2' is disposed on the via VA. The metal capping layer CP2' only covers the via VA and does not cover the interlayer dielectric layer ILD21. In this embodiment, the metal capping layer CP2' may be formed through the selective deposition.

The etching stop bi-layer structure ESBS2' includes, for example, the hermetic layer HM3, the conformal etching stop layer ESL4, and the hermetic layer HM4. A self-aligned etching stop layer ESL3' (shown in FIG. 33G) formed on the via VA only is removed. The hermetic layer HM3 is disposed on the interlayer dielectric layer ILD21. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2'. The metal layer MT2 is embedded in the interlayer dielectric layer ILD22.

The barrier layer BR22' and the liner layer LN22' are disposed between the interlayer dielectric layer ILD22 and the metal layer MT2, between the interlayer dielectric layer ILD21 and the metal layer MT2. The metal layer MT2 is directly connected to the metal capping layer CP2'. The barrier layer BR22' and the liner layer LN22' are not disposed between the metal capping layer CP2' and the metal layer MT2.

In the embodiment shown in the FIG. 21, the self-aligned etching stop layer ESL1' is self-formed on the metal capping layer CP1' without any selective deposition process, so the self-aligned etching stop layer ESL1' is only disposed on the metal capping layer CP1'. The self-aligned etching stop layer ESL3' (shown in FIG. 33G) formed on the via VA only is removed, so the there is no self-aligned etching stop layer ESL3' (shown in FIG. 33G) in the semiconductor structure D-6. The parasitic capacitance of the interconnection can be effectively decreased due to the reduction of the high-k material used for the self-aligned etching stop layer ESL1' or the self-aligned etching stop layer ESL3' (shown in FIG. 33G).

Figure 22:
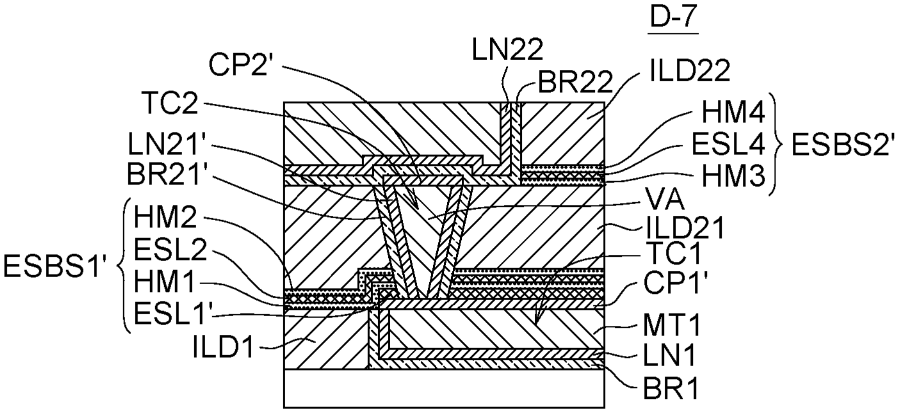
FIG. 22 shows a semiconductor structure D-7 according to another embodiment.

Please refer to FIG. 22, which shows a semiconductor structure D-7 according to another embodiment. The semiconductor structure D-7 is an interconnection for two metal layers MT1, MT2 with single damascene in the back-end-of-line (BEOL) process. The semiconductor structure D-7 includes, for example, the interlayer dielectric (ILD) layer ILD1, the barrier layer BR1, the liner layer LN1, the metal layer MT1, the metal capping layer CP1', the etching stop bi-layer structure ESBS1', the interlayer dielectric layer ILD21, the barrier layer BR21', the liner layer LN21', the via VA, a metal capping layer CP2', an etching stop bi-layer structure ESBS2', the interlayer dielectric layer ILD22, the barrier layer BR22, the liner layer LN22 and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The metal capping layer CP1' is disposed on the metal layer MT1. The metal capping layer CP1' only covers the metal layer MT1 and does not cover the interlayer dielectric layer ILD1. In this embodiment, the metal capping layer CP1' may be formed through the selective deposition.

The etching stop bi-layer structure ESBS1' includes, for example, the self-aligned etching stop layer ESL1', the hermetic layer HM1, the conformal etching stop layer ESL2, and the hermetic layer HM2. The self-aligned etching stop layer ESL1' is disposed on the interlayer dielectric layer ILD1 and the metal capping layer CP1'. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2. In this embodiment, the self-aligned etching stop layer ESL1' is formed through a thermal treatment, a photo treatment or a bias-assist treatment on a metal conductor with metal dopants. The metal conductor with the metal dopants is filled in the trench TC1. After the thermal treatment, the photo treatment or the bias-assist treatment, the dopants will be gathered at the top of the metal capping layer CP1' to form the metal layer MT1 and the self-aligned etching stop layer ESL' disposed on the metal capping layer CP1'.

The interlayer dielectric layer ILD21 is disposed on the etching stop bi-layer structure ESBS1'. The via VA is embedded in the interlayer dielectric layer ILD21'.

The barrier layer BR21' and the liner layer LN21' are disposed between the interlayer dielectric layer ILD21 and the via VA. The via VA is directly connected to the metal capping layer CP1'. The barrier layer BR21' and the liner layer LN21' are not disposed between the via VA and the metal capping layer CP1'.

The metal capping layer CP2' is disposed on the via VA. The metal capping layer CP2' only covers the via VA and does not cover the interlayer dielectric layer ILD21. In this embodiment, the metal capping layer CP2' may be formed through the selective deposition.

The etching stop bi-layer structure ESBS2' includes, for example, the hermetic layer HM3, the conformal etching stop layer ESL4, and the hermetic layer HM4. A self-aligned etching stop layer ESL3' (shown in FIG. 33G) formed on the via VA only is removed. The hermetic layer HM3 is disposed on the interlayer dielectric layer ILD21. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2'. The metal layer MT2 is embedded in the interlayer dielectric layer ILD22.

The barrier layer BR22 and the liner layer LN22 are disposed between the interlayer dielectric layer ILD22 and the metal layer MT2, between the interlayer dielectric layer ILD21 and the metal layer MT2, and between the metal capping layer CP2' and the metal layer MT2.

In the embodiment shown in the FIG. 22, the self-aligned etching stop layer ESL1' is self-formed on the metal capping layer CP1' without any selective deposition process, so the self-aligned etching stop layer ESL1' is only disposed on the metal capping layer CP1'. The self-aligned etching stop layer ESL3' (shown in FIG. 33G) formed on the via VA only is removed, so the there is no self-aligned etching stop layer ESL3' (shown in FIG. 33G) in the semiconductor structure D-7. The parasitic capacitance of the interconnection can be effectively decreased due to the reduction of the high-k material used for the self-aligned etching stop layer ESL1' or the self-aligned etching stop layer ESL3' (shown in FIG. 33G).

Figure 23:
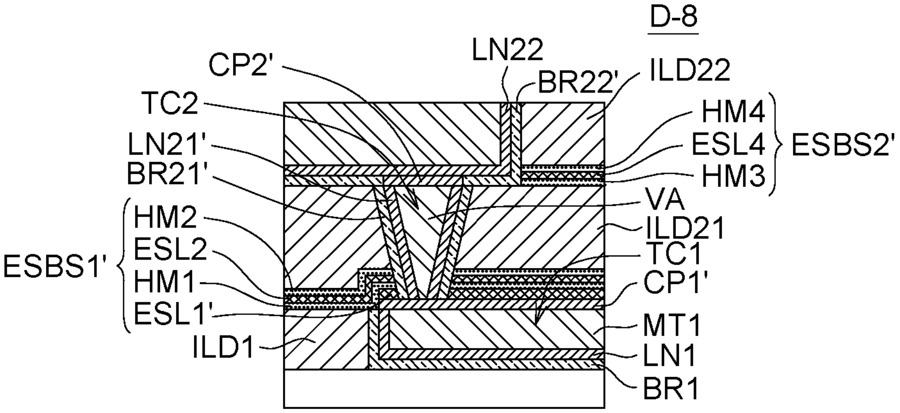
FIG. 23 shows a semiconductor structure D-8 according to another embodiment.

Please refer to FIG. 23, which shows a semiconductor structure D-8 according to another embodiment. The semiconductor structure D-8 is an interconnection for two metal layers MT1, MT2 with single damascene in the back-end-of-line (BEOL) process. The semiconductor structure D-8 includes, for example, the interlayer dielectric (ILD) layer ILD1, the barrier layer BR1, the liner layer LN1, the metal layer MT1, the metal capping layer CP1', the etching stop bi-layer structure ESBS1', the interlayer dielectric layer ILD21, the barrier layer BR21', the liner layer LN21', the via VA, a metal capping layer CP2', an etching stop bi-layer structure ESBS2', the interlayer dielectric layer ILD22, the barrier layer BR22', the liner layer LN22 and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The metal capping layer CP1' is disposed on the metal layer MT1. The metal capping layer CP1' only covers the metal layer MT1 and does not cover the interlayer dielectric layer ILD1. In this embodiment, the metal capping layer CP1' may be formed through the selective deposition.

The etching stop bi-layer structure ESBS1' includes, for example, the self-aligned etching stop layer ESL1', the hermetic layer HM1, the conformal etching stop layer ESL2, and the hermetic layer HM2. The self-aligned etching stop layer ESL1' is disposed on the interlayer dielectric layer ILD1 and the metal capping layer CP1'. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2. In this embodiment, the self-aligned etching stop layer ESL1' is formed through a thermal treatment, a photo treatment or a bias-assist treatment on a metal conductor with metal dopants. The metal conductor with the metal dopants is filled in the trench TC1. After the thermal treatment, the photo treatment or the bias-assist treatment, the dopants will be gathered at the top of the metal capping layer CP1' to form the metal layer MT1 and the self-aligned etching stop layer ESL1' disposed on the metal capping layer CP1'.

The interlayer dielectric layer ILD21 is disposed on the etching stop bi-layer structure ESBS1'. The via VA is embedded in the interlayer dielectric layer ILD21'.

The barrier layer BR21' and the liner layer LN21' are disposed between the interlayer dielectric layer ILD21 and the via VA. The via VA is directly connected to the metal capping layer CP1'. The barrier layer BR21' and the liner layer LN21' are not disposed between the via VA and the metal capping layer CP1'.

The metal capping layer CP2' is disposed on the via VA. The metal capping layer CP2' only covers the via VA and does not cover the interlayer dielectric layer ILD21. In this embodiment, the metal capping layer CP2' may be formed through the selective deposition.

The etching stop bi-layer structure ESBS2' includes, for example, the hermetic layer HM3, the conformal etching stop layer ESL4, and the hermetic layer HM4. A self-aligned etching stop layer ESL3' (shown in FIG. 33G) formed on the via VA only is removed. The hermetic layer HM3 is disposed on the interlayer dielectric layer ILD21. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2'. The metal layer MT2 is embedded in the interlayer dielectric layer ILD22.

The barrier layer BR22' and the liner layer LN22 are disposed between the interlayer dielectric layer ILD22 and the metal layer MT2, and between the interlayer dielectric layer ILD21 and the metal layer MT2. Only the liner layer LN22 is disposed between the metal layer MT2 and the metal capping layer CP2'. The barrier layer BR22' is not disposed between the metal layer MT2 and the metal capping layer CP2'.

In the embodiment shown in the FIG. 23, the self-aligned etching stop layer ESL1' is self-formed on the metal capping layer CP1' without any selective deposition process, so the self-aligned etching stop layer ESL1' is only disposed on the metal capping layer CP1'. The self-aligned etching stop layer ESL3' (shown in FIG. 33G) formed on the via VA only is removed, so the there is no self-aligned etching stop layer ESL3' (shown in FIG. 33G) in the semiconductor structure D-8. The parasitic capacitance of the interconnection can be effectively decreased due to the reduction of the high-k material used for the self-aligned etching stop layer ESL1' or the self-aligned etching stop layer ESL3' (shown in FIG. 33G).

Figure 24:
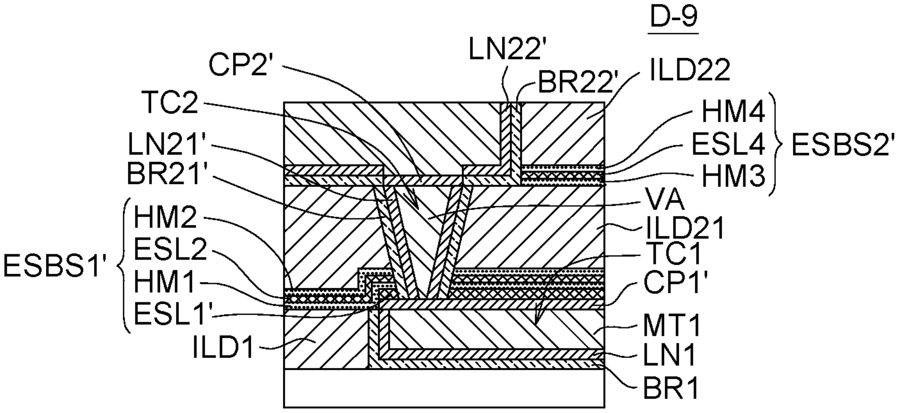
FIG. 24 shows a semiconductor structure D-9 according to another embodiment.

Please refer to FIG. 24, which shows a semiconductor structure D-9 according to another embodiment. The semiconductor structure D-9 is an interconnection for two metal layers MT1, MT2 with single damascene in the back-end-of-line (BEOL) process. The semiconductor structure D-9 includes, for example, the interlayer dielectric (ILD) layer ILD1, the barrier layer BR1, the liner layer LN1, the metal layer MT1, the metal capping layer CP1', the etching stop bi-layer structure ESBS1', the interlayer dielectric layer ILD21, the barrier layer BR21', the liner layer LN21', the via VA, a metal capping layer CP2', an etching stop bi-layer structure ESBS2', the interlayer dielectric layer ILD22, the barrier layer BR22', the liner layer LN22' and the metal layer MT2.

The metal layer MT1 is embedded in the interlayer dielectric layer ILD1. The barrier layer BR1 and the liner layer LN1 are disposed between the metal layer MT1 and the interlayer dielectric layer ILD1.

The metal capping layer CP1' is disposed on the metal layer MT1. The metal capping layer CP1' only covers the metal layer MT1 and does not cover the interlayer dielectric layer ILD1. In this embodiment, the metal capping layer CP1' may be formed through the selective deposition.

The etching stop bi-layer structure ESBS1' includes, for example, the self-aligned etching stop layer ESL1', the hermetic layer HM1, the conformal etching stop layer ESL2, and the hermetic layer HM2. The self-aligned etching stop layer ESL1' is disposed on the interlayer dielectric layer ILD1 and the metal capping layer CP1'. The hermetic layer HM1 is disposed on the conformal etching stop layer ESL1. The conformal etching stop layer ESL2 is disposed on the hermetic layer HM1. The hermetic layer HM2 is disposed on the conformal etching stop layer ESL2. In this embodiment, the self-aligned etching stop layer ESL1' is formed through a thermal treatment, a photo treatment or a bias-assist treatment on a metal conductor with metal dopants. The metal conductor with the metal dopants is filled in the trench TC1. After the thermal treatment, the photo treatment or the bias-assist treatment, the dopants will be gathered at the top of the metal capping layer CP1' to form the metal layer MT1 and the self-aligned etching stop layer ESL1' disposed on the metal capping layer CP1'.

The interlayer dielectric layer ILD21 is disposed on the etching stop bi-layer structure ESBS1'. The via VA is embedded in the interlayer dielectric layer ILD21'.

The barrier layer BR21' and the liner layer LN21' are disposed between the interlayer dielectric layer ILD21 and the via VA. The via VA is directly connected to the metal capping layer CP1'. The barrier layer BR21' and the liner layer LN21' are not disposed between the via VA and the metal capping layer CP1'.

The metal capping layer CP2' is disposed on the via VA. The metal capping layer CP2' only covers the via VA and does not cover the interlayer dielectric layer ILD21. In this embodiment, the metal capping layer CP2' may be formed through the selective deposition.

The etching stop bi-layer structure ESBS2' includes, for example, the hermetic layer HM3, the conformal etching stop layer ESL4, and the hermetic layer HM4. A self-aligned etching stop layer ESL3' (shown in FIG. 33G) formed on the via VA only is removed. The hermetic layer HM3 is disposed on the interlayer dielectric layer ILD21. The conformal etching stop layer ESL4 is disposed on the hermetic layer HM3. The hermetic layer HM4 is disposed on the conformal etching stop layer ESL4.

The interlayer dielectric layer ILD22 is disposed on the etching stop bi-layer structure ESBS2'. The metal layer MT2 is embedded in the interlayer dielectric layer ILD22.

The barrier layer BR22' and the liner layer LN22' are disposed between the interlayer dielectric layer ILD22 and the metal layer MT2, and between the interlayer dielectric layer ILD21 and the metal layer MT2. The metal layer MT2 is directly connected to the metal capping layer CP2'. The barrier layer BR22' and the liner layer LN22' are not disposed between the metal layer MT2 and the metal capping layer CP2'.

In the embodiment shown in the FIG. 24, the self-aligned etching stop layer ESL1' is self-formed on the metal capping layer CP1' without any selective deposition process, so the self-aligned etching stop layer ESL1' is only disposed on the metal capping layer CP1'. The self-aligned etching stop layer ESL3' (shown in FIG. 33G) formed on the via VA only is removed, so the there is no self-aligned etching stop layer ESL3' (shown in FIG. 33G) in the semiconductor structure D-9. The parasitic capacitance of the interconnection can be effectively decreased due to the reduction of the high-k material used for the self-aligned etching stop layer ESL1' or the self-aligned etching stop layer ESL3' (shown in FIG. 33G).

Please refer to FIGS. 25A to 25I, which illustrate a manufacturing method of the semiconductor structure A-1. As shown in the FIG. 25A, the trench TC1 is formed in the interlayer dielectric (ILD) layer ILD1 and the barrier layer BR1 and the liner layer LN1 are formed on the interlayer dielectric layer ILD1, the bottom surface of the trench TC1 and the later-wall of the trench TC1. In this step, the trench TC1 could be formed, for example, by wet etching, dry etching or other suitable process. Moreover, the barrier layer BR1 and the liner layer LN1 could be formed, for example, by Chemical Vapor Deposition (CVD), Physical Vapor Deposition (PVD), plating or other suitable processes.

Figure 25A:
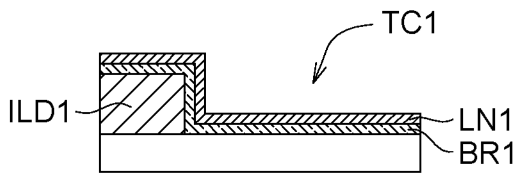
FIGS. 25A to 25I illustrate a manufacturing method of the semiconductor structure A-1.
Figure 25B:
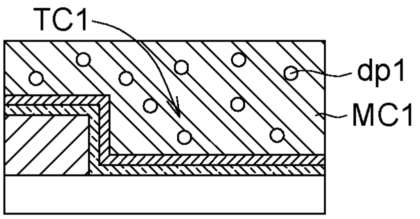

Next, as shown in the FIG. 25B, the metal conductor MC1 with metal dopants dp1 is filled in the trench TC1. In this step, the metal conductor MC1 with the metal dopants dp1 could be filled by, for example, Chemical Vapor Deposition (CVD), Atomic Layer Deposition (ALD), Physical Vapor Deposition (PVD), Electro Chemical Plating (ECP), Electroless plating, or other suitable processes. In this step, a process temperature is 10° C. to 400° C.

Figure 25C:
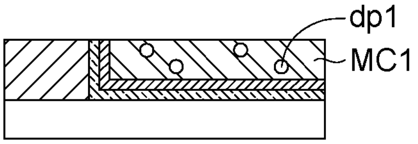

Then, as shown in the FIG. 25C, the planarization is performed on the metal conductor MC1 with the metal dopants dp1. In this step, the planarization could be performed by, for example, Chemical-Mechanical Planarization (CMP) or other suitable processes.

Figure 25D:
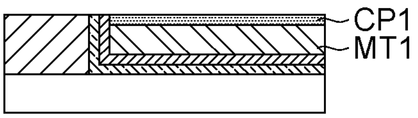

Next, as shown in the FIG. 25D, a thermal treatment, a photo treatment or a bias-assist treatment is performed on the metal conductor MC1 with the metal dopants dp1 to form the self-forming metal capping layer CP1 on the metal layer MT1. In this step, the thermal treatment is performed by a hotplate, the photo treatment is performed by a laser, and the bias-assist treatment is performed by applying a voltage. After the thermal treatment, the photo treatment or the bias-assist treatment, the dopants dp1 will be gathered at the top of the metal conductor MC1 to form the metal layer MT1 and the self-forming metal capping layer CP1 disposed thereon. In this step, a process temperature is 10° C. to 400° C. The process temperature in the step shown in the FIG. 25B is lower than the process temperature in the step shown in the FIG. 25D.

Figure 25E:
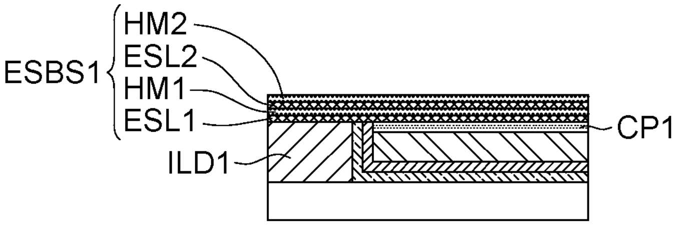

Afterwards, as shown in the FIG. 25E, the etching stop bi-layer structure ESBS1 is formed on the interlayer dielectric layer ILD1 and the self-forming metal capping layer CP1.

Figure 25F:
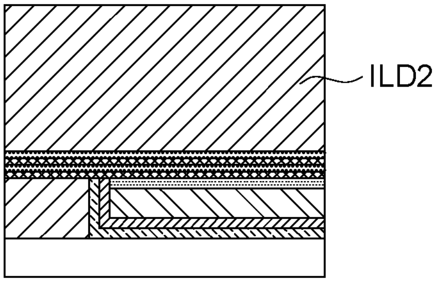

Next, as shown in the FIG. 25F, the interlayer dielectric layer ILD2 is formed on the etching stop bi-layer structure ESBS1. In this step, the interlayer dielectric layer ILD2 could be formed, for example, by spin coating, Plasma Enhanced Chemical Vapor Deposition (PECVD), Plasma Enhanced Atomic Layer Deposition (PEALD) or other suitable process.

Figure 25G:
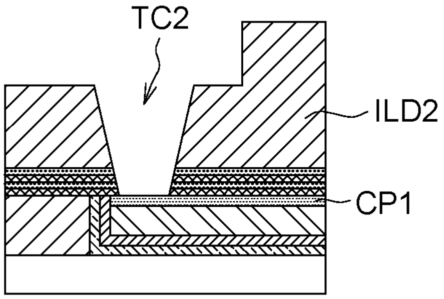

Then, as shown in the FIG. 25G, the trench TC2 is formed in the interlayer dielectric layer ILD2. The trench TC2 exposes the self-forming metal capping layer CP1. In this step, the trench TC2 could be formed, for example, by wet etching, dry etching or other suitable process.

Figure 25H:
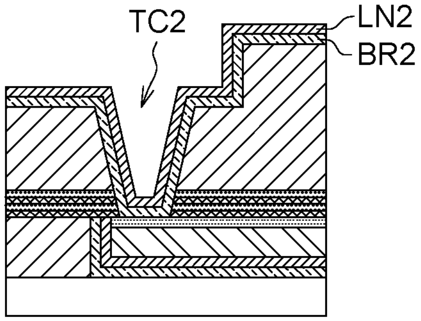

Next, as shown in the FIG. 25H, the barrier layer BR2 and the liner layer LN2 are formed on the interlayer dielectric layer ILD2, the bottom surface of the trench TC2 and the later-wall of the trench TC2. The barrier layer BR2 and the liner layer LN2 could be formed, for example, by Chemical Vapor Deposition (CVD), Physical Vapor Deposition (PVD), plating or other suitable processes.

Figure 25I:
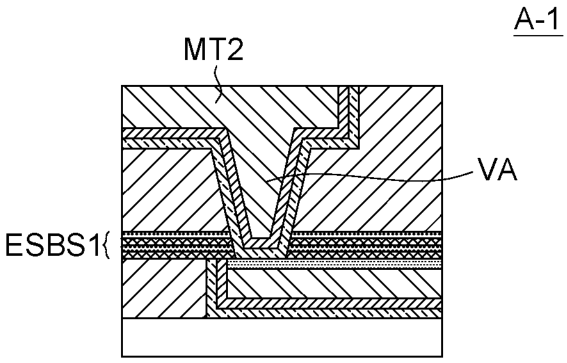

Then, as shown in the FIG. 25I, the via VA and the metal layer MT2 are formed on in the trench TC2. As such, the semiconductor structure A-1 is formed through the FIGS. 25A to 25I.

In the embodiment shown in the FIGS. 25A to 25I, the self-forming metal capping layer CP1 is self-formed on the metal layer MT1 without any selective deposition process. Therefore, any metallic residue would not be formed on the interface between the interlayer dielectric layer ILD1 and the etching stop bi-layer structure ESBS1. The selectivity loss issue which caused by conventional metal-on-metal (MoM) selective deposition process for the metal cap would be avoided.

Please refer to FIGS. 26A to 26E, which illustrate a manufacturing method of the semiconductor structure A-2. As shown in the FIG. 26A, the trench TC2 is formed in the interlayer dielectric layer ILD2.

Figure 26A:
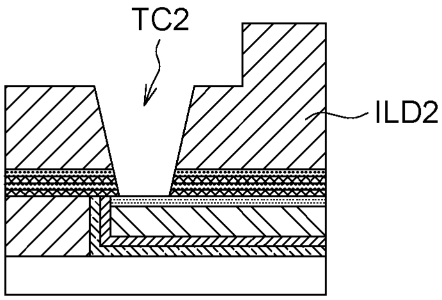
FIGS. 26A to 26E illustrate a manufacturing method of the semiconductor structure A-2.
Figure 26B:
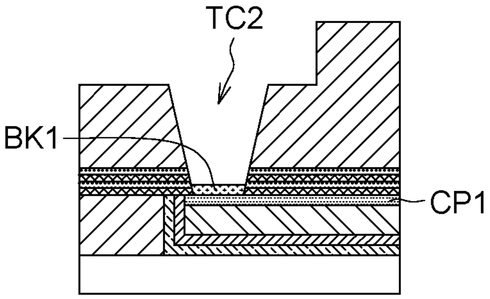

Next, as shown in the FIG. 26B, a blocking layer BK1 is formed on the self-forming metal capping layer CP1 and located at the bottom surface of the trench TC2.

Figure 26C:
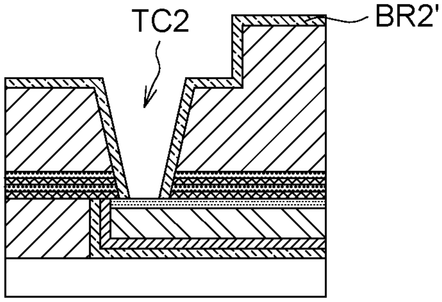

Then, as shown in the FIG. 26C, the barrier layer BR2' is formed on the interlayer dielectric layer ILD2 and the lateral wall of the trench TC2, and then the blocking layer BK1 is removed.

Figure 26D:
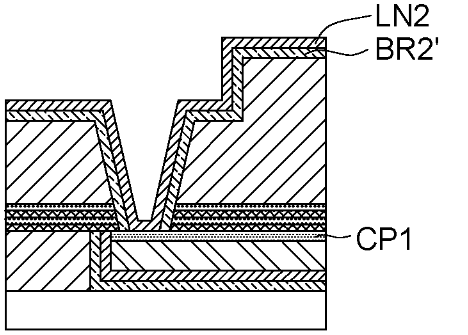

Next, as shown in the FIG. 26D, the liner layer LN1 is formed on the barrier layer BR2' and the self-forming metal capping layer CP1.

Figure 26E:
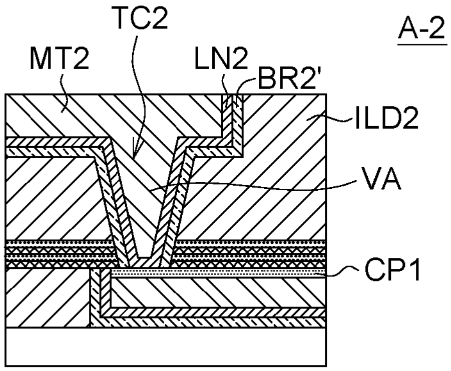

Afterwards, as shown in the FIG. 26E, the via VA and the metal layer MT2 are formed in the trench TC2. As such, the semiconductor structure A-2 is formed through the FIGS. 26A to 26E.

In the embodiment shown in the FIGS. 26A to 26E, the blocking layer BK1 is used to block the forming of the barrier layer BR2', such that only the liner layer LN2 is disposed between the via VA and the self-forming metal capping layer CP1.

Please refer to FIGS. 27A to 27F, which illustrate a manufacturing method of the semiconductor structure A-3. As shown in the FIG. 27A, the trench TC2 is formed in the interlayer dielectric layer ILD2.

Figure 27A:
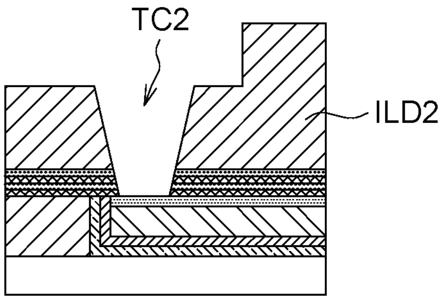
FIGS. 27A to 27F illustrate a manufacturing method of the semiconductor structure A-3.
Figure 27B:
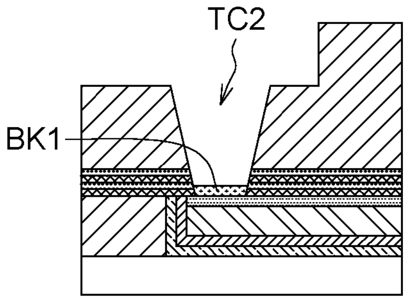

Next, as shown in the FIG. 27B, a blocking layer BK1 is formed on the self-forming metal capping layer CP1 and located at the bottom surface of the trench TC2.

Figure 27C:
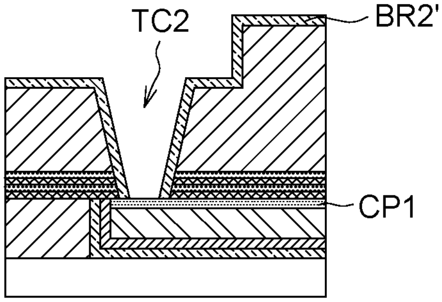

Then, as shown in the FIG. 27C, the barrier layer BR2' is formed on the interlayer dielectric layer ILD2 and the lateral wall of the trench TC2, and then the blocking layer BK1 is removed.

Figure 27D:
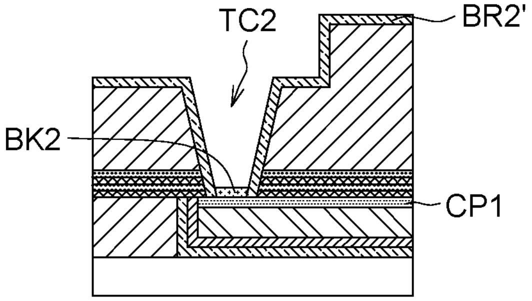

Afterwards, as shown in the FIG. 27D, a blocking layer BK2 is formed on the self-forming metal capping layer CP1 and located at the bottom surface of the trench TC2.

Figure 27E:
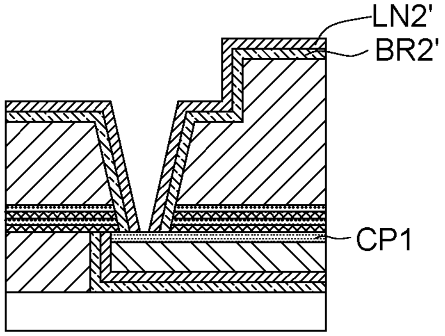

Next, as shown in the FIG. 27E, the liner layer LN2' is formed on the barrier layer BR2', and then the blocking layer BK2 is removed.

Figure 27F:
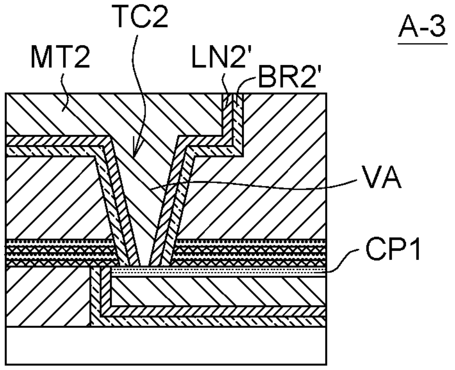

Afterwards, as shown in the FIG. 27F, the via VA and the metal layer MT2 are formed in the trench TC2. As such, the semiconductor structure A-3 is formed through the FIGS. 27A to 27F.

In the embodiment shown in the FIGS. 27A to 27F, the blocking layer BK1 is used to block the forming of the barrier layer BR2' and the liner layer LN2', such that the barrier layer BR2' and the liner layer LN2 are not disposed between the via VA and the self-forming metal capping layer CP1.

Figure 28A:
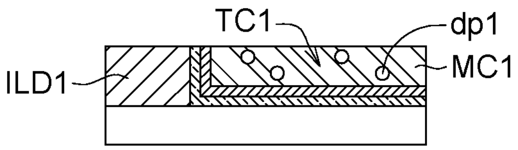
FIGS. 28A to 28M illustrate a manufacturing method of the semiconductor structure B-1.

Please refer to FIGS. 28A to 28M, which illustrate a manufacturing method of the semiconductor structure B-1. As shown in the FIG. 28A, the metal conductor MC1 with metal dopants dp1 is filled in the trench TC1 of the interlayer dielectric layer ILD1 and the planarization is performed on the metal conductor MC1 with the metal dopants dp1.

Figure 28B:
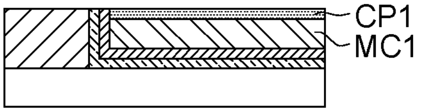

Next, as shown in the FIG. 28B, the thermal treatment, the photo treatment or the bias-assist treatment is performed on the metal conductor MC1 with the metal dopants dp1 to form the self-forming metal capping layer CP1 on the metal layer MT1.

Figure 28C:
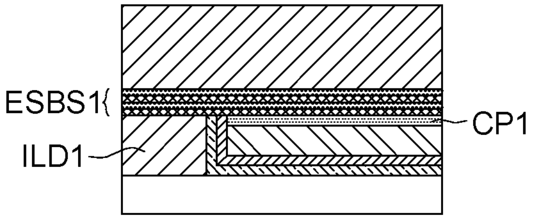

Afterwards, as shown in the FIG. 28C, the etching stop bi-layer structure ESBS1 is formed on the interlayer dielectric layer ILD1 and the self-forming metal capping layer CP1, and the interlayer dielectric layer ILD21 is formed on the etching stop bi-layer structure ESBS1.

Figure 28D:
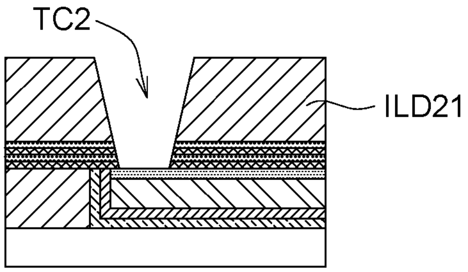

Then, as shown in the FIG. 28D, the trench TC2 is formed in the interlayer dielectric layer ILD21. The trench TC2 exposes the self-forming metal capping layer CP1.

Figure 28E:
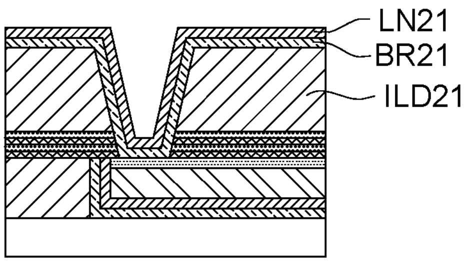

Next, as shown in the FIG. 28E, the barrier layer BR21 and the liner layer LN21 are formed on the interlayer dielectric layer ILD21, the bottom surface of the trench TC2 and the later-wall of the trench TC2.

Figure 28F:
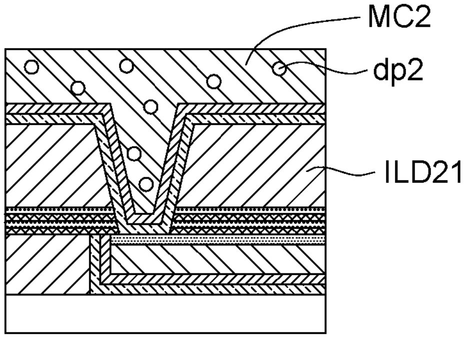

Then, as shown in the FIG. 28F, a metal conductor MC2 with metal dopants dp2 is filled in the trench TC2 of the interlayer dielectric layer ILD21. In this step, the metal conductor MC2 with the metal dopants dp2 could be filled by, for example, Chemical Vapor Deposition (CVD), Atomic Layer Deposition (ALD), Physical Vapor Deposition (PVD), Electro Chemical Plating (ECP), Electroless plating, or other suitable processes. In this step, a process temperature is 10° C. to 400° C.

Figure 28G:
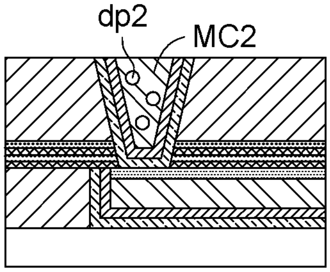

Next, as shown in the FIG. 28G, the planarization is performed on the metal conductor MC2 with the metal dopants dp2. In this step, the planarization could be performed by, for example, Chemical-Mechanical Planarization (CMP) or other suitable processes.

Figure 28H:
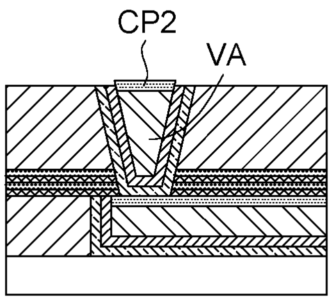

Afterwards, as shown in the FIG. 28H, a thermal treatment, a photo treatment or a bias-assist treatment is performed on the metal conductor MC2 with the metal dopants dp2 to form the self-forming metal capping layer CP2 on the via VA. In this step, the thermal treatment is performed by a hotplate, the photo treatment is performed by a laser, and the bias-assist treatment is performed by applying a voltage. After the thermal treatment, the photo treatment or the bias-assist treatment, the dopants dp1 will be gathered at the top of the metal conductor MC2 to form the via VA and the self-forming metal capping layer CP2 disposed thereon. In this step, a process temperature is 10° C. to 400° C. The process temperature in the step shown in the FIG. 28F is lower than the process temperature in the step shown in the FIG. 28H.

Figure 28I:
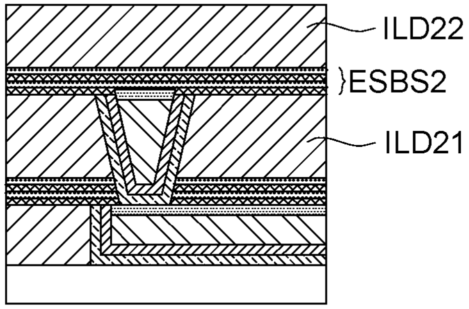

Next, as shown in the FIG. 28I, the etching stop bi-layer structure ESBS2 is formed on the interlayer dielectric layer ILD21 and the self-forming metal capping layer CP2, and the interlayer dielectric layer ILD22 is formed on the etching stop bi-layer structure ESBS2. In this step, the interlayer dielectric layer ILD22 could be formed, for example, by spin coating, Plasma Enhanced Chemical Vapor Deposition (PECVD), Plasma Enhanced Atomic Layer Deposition (PEALD) or other suitable process.

Figure 28J:
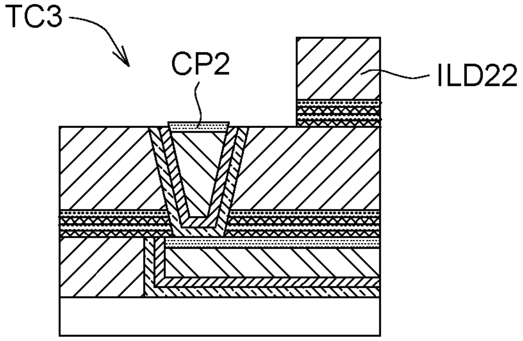

Then, as shown in the FIG. 28J, a trench TC3 is formed in the interlayer dielectric layer ILD22. The trench TC3 exposes the self-forming metal capping layer CP2.

Figure 28K:
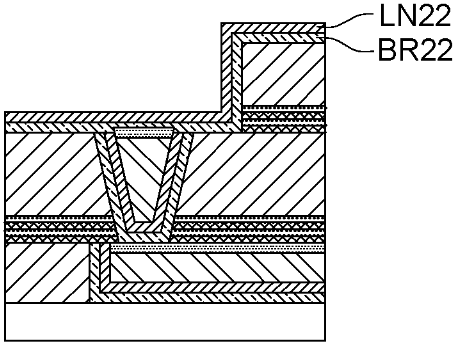

Next, as shown in the FIG. 28K, the barrier layer BR22 and the liner layer LN22 are formed on the interlayer dielectric layer ILD22, the bottom surface of the trench TC3 and the later-wall of the trench TC3.

Figure 28L:
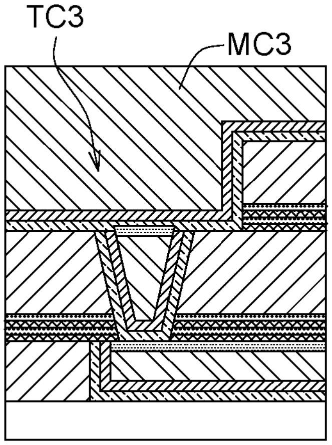

Afterwards, as shown in the FIG. 28L, a metal conductor MT3 is filled in the trench TC3.

Figure 28M:
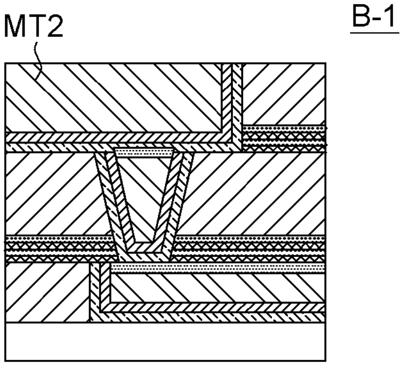

Then, as shown in the FIG. 28M, the planarization is performed on the metal conductor MC3. In this step, the planarization could be performed by, for example, Chemical-Mechanical Planarization (CMP) or other suitable processes. As such, the semiconductor structure B-1 is formed through the FIGS. 28A to 28M.

In the embodiment shown in the FIGS. 28A to 28M, the self-forming metal capping layer CP1 is self-formed on the metal layer MT1 without any selective deposition process. Therefore, any metallic residue would not be formed on the interface between the interlayer dielectric layer ILD1 and the etching stop bi-layer structure ESBS1. The self-forming metal capping layer CP2 is self-formed on the via VA without any selective deposition process. Therefore, any metallic residue would not be formed on the interface between the interlayer dielectric layer ILD21 and the etching stop bi-layer structure ESBS2. The selectivity loss issue which caused by conventional metal-on-metal (MoM) selective deposition process for the metal cap would be avoided.

Figure 29A:
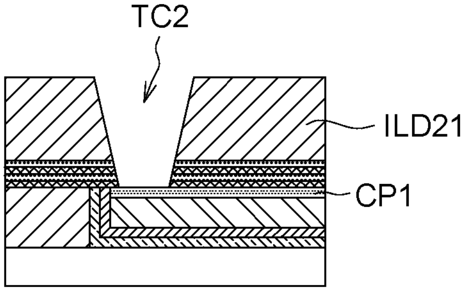
FIGS. 29A to 29O illustrate a manufacturing method of the semiconductor structure B-9.
Figure 29B:
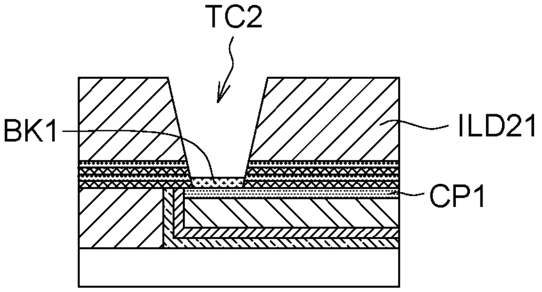
Figure 29C:
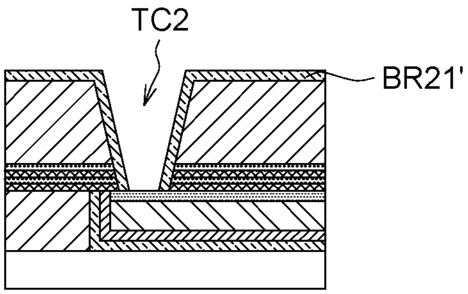
Figure 29D:
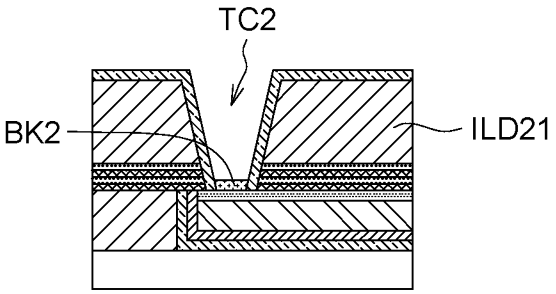
Figure 29E:
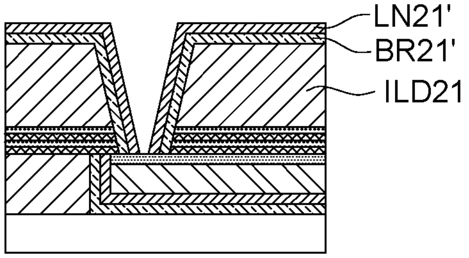
Figure 29F:
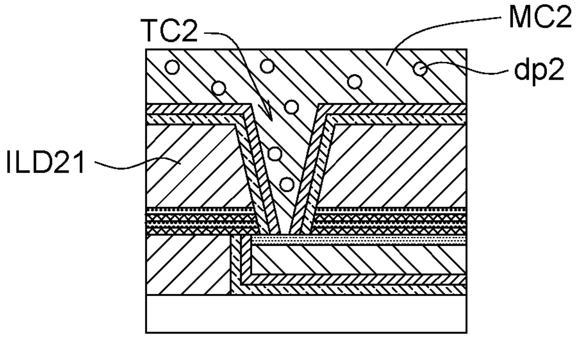
Figure 29G:
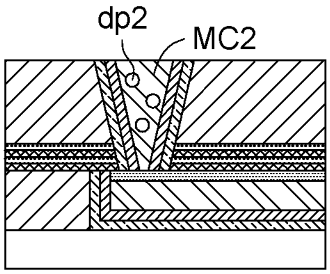
Figure 29H:
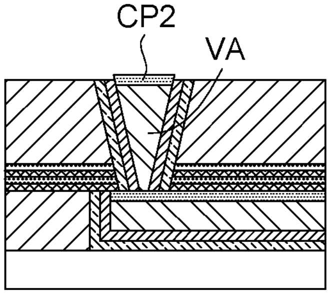
Figure 29I:
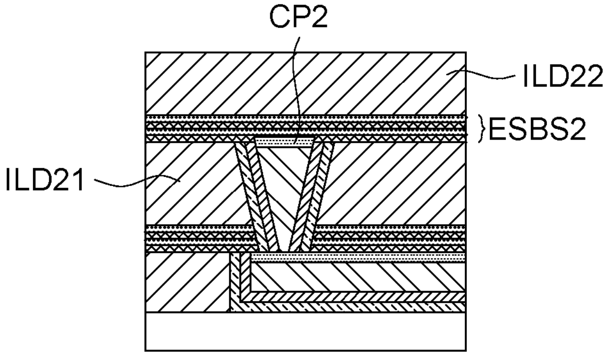
Figure 29J:
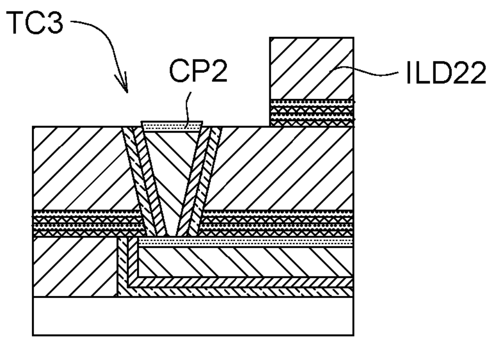
Figure 29K:
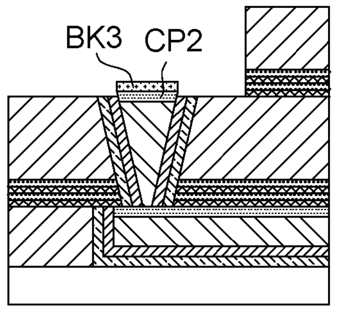
Figure 29L:
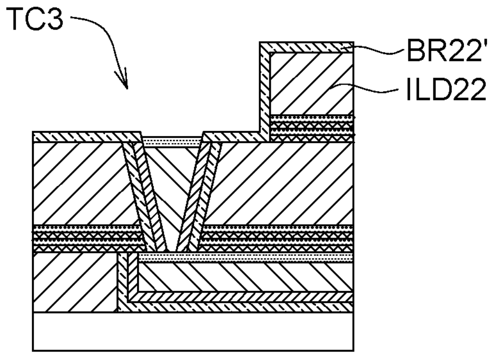
Figure 29M:
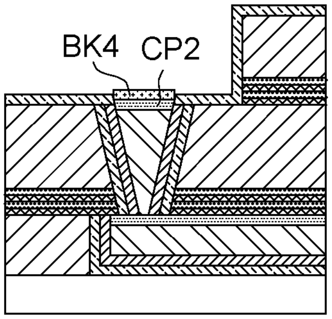
Figure 29N:
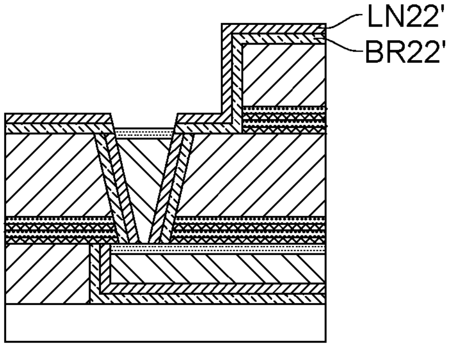
Figure 29O:
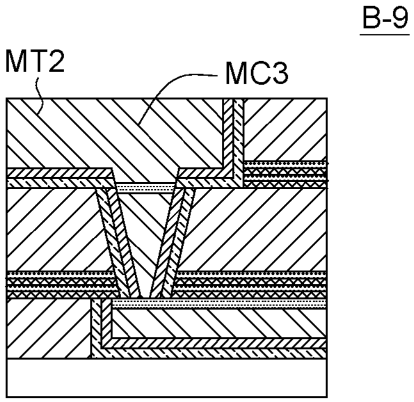

Please refer to FIGS. 29A to 29O, which illustrate a manufacturing method of the semiconductor structure B-9. As shown in the FIG. 29A, the trench TC2 is formed in the interlayer dielectric layer ILD21. The trench TC2 exposes the self-forming metal capping layer CP1.

Next, as shown in the FIG. 29B, the blocking layer BK1 is formed on the self-forming metal capping layer CP1 and located at the bottom surface of the trench TC2.

Then, as shown in the FIG. 29C, the barrier layer BR21' is formed on the interlayer dielectric layer ILD21, the bottom surface of the trench TC2 and the later-wall of the trench TC2.

Next, as shown in the FIG. 29D, the blocking layer BK2 is formed on the interlayer dielectric layer ILD21, the bottom surface of the trench TC2 and the later-wall of the trench TC2.

Afterwards, as shown in the FIG. 29E, the liner layer LN21' is formed on the barrier layer BR21', and then the blocking layer BK2 is removed.

Then, as shown in the FIG. 29F, the metal conductor MC2 with the metal dopants dp2 is filled in the trench TC2 of the interlayer dielectric layer ILD21.

Next, as shown in the FIG. 29G, the planarization is performed on the metal conductor MC2 with the metal dopants dp2.

Afterwards, as shown in the FIG. 29H, the thermal treatment, the photo treatment or the bias-assist treatment is performed on the metal conductor MC2 with the metal dopants dp2 to form the self-forming metal capping layer CP2 on the via VA.

Next, as shown in the FIG. 29I, the etching stop bi-layer structure ESBS2 is formed on the interlayer dielectric layer ILD21 and the self-forming metal capping layer CP2, and the interlayer dielectric layer ILD22 is formed on the etching stop bi-layer structure ESBS2.

Then, as shown in the FIG. 29J, the trench TC3 is formed in the interlayer dielectric layer ILD22. The trench TC3 exposes the self-forming metal capping layer CP2.

Next, as shown in the FIG. 29K, a blocking layer BK3 is formed on the self-forming metal capping layer CP2.

Then, as shown in the FIG. 29L, the barrier layer BR22' is formed on the interlayer dielectric layer ILD22, the bottom surface of the trench TC3 and the later-wall of the trench TC3, and then the blocking layer BK3 is removed.

Afterwards, as shown in the FIG. 29M, a blocking layer BK4 is formed on the self-forming metal capping layer CP2.

Then, as shown in the FIG. 29N, the liner layer LN22' is formed on the barrier layer BR22', and then the blocking layer BK4 is removed.

Afterwards, as shown in the FIG. 29O, the metal conductor MC3 is filled in the trench TC3 to form the metal layer MT2. As such, the semiconductor structure B-9 is formed through the FIGS. 29A to 29O.

In the embodiment shown in the FIGS. 29A to 28O, the self-forming metal capping layer CP1 is self-formed on the metal layer MT1 without any selective deposition process. Therefore, any metallic residue would not be formed on the interface between the interlayer dielectric layer ILD1 and the etching stop bi-layer structure ESBS1. The self-forming metal capping layer CP2 is self-formed on the via VA without any selective deposition process. Therefore, any metallic residue would not be formed on the interface between the interlayer dielectric layer ILD21 and the etching stop bi-layer structure ESBS2. The selectivity loss issue which caused by conventional metal-on-metal (MoM) selective deposition process for the metal cap would be avoided.

Please refer to FIGS. 30A to 30J, which illustrate a manufacturing method of the semiconductor structure C-1. As shown in the FIG. 30A, a metal conductor MC4 with metal dopants dp4 is filled in the trench TC1 of the interlayer dielectric (ILD) layer ILD1. In this step, the metal conductor MC4 with the metal dopants dp4 could be filled by, for example, Chemical Vapor Deposition (CVD), Atomic Layer Deposition (ALD), Physical Vapor Deposition (PVD), Electro Chemical Plating (ECP), Electroless plating, or other suitable processes. In this step, a process temperature is 10° C. to 400° C.

Figure 30A:
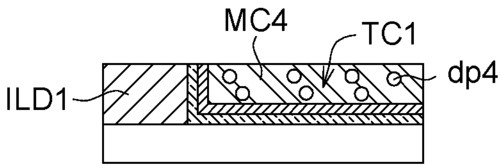
FIGS. 30A to 30J illustrate a manufacturing method of the semiconductor structure C-1.
Figure 30B:
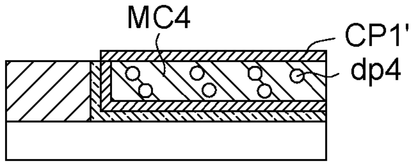

Next, as shown in the FIG. 30B, the metal capping layer CP1' is formed on the metal conductor MC4 with the metal dopants dp4. In this step, the metal capping layer CP1' is formed by selective deposition process.

Figure 30C:
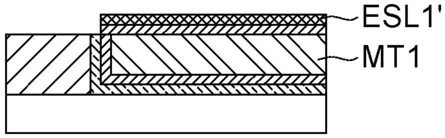

Then, as shown in the FIG. 30C, a thermal treatment, a photo treatment or a bias-assist treatment is performed on the metal conductor MC4 with the metal dopants dp4 to form the self-aligned etching stop layer ESL1' and the first metal layer MT1. The self-aligned etching stop layer ESL1' is formed on the metal capping layer CP1'. In this step, the thermal treatment is performed by a hotplate, the photo treatment is performed by a laser, and the bias-assist treatment is performed by applying a voltage. After the thermal treatment, the photo treatment or the bias-assist treatment, the dopants dp3 will be gathered at the top of the metal capping layer CP1' to form the metal layer MT1 and the self-aligned etching stop layer ESL1'. In this step, a process temperature is 10° C. to 400° C. The process temperature in the step shown in the FIG. 30C is lower than the process temperature in the step shown in the FIG. 30A.

Figure 30D:
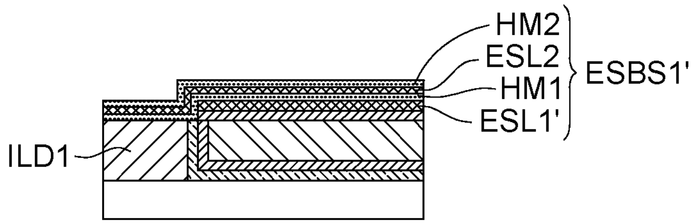

Afterwards, as shown in the FIG. 30D, the hermetic layer HM1, the conformal etching stop layer ESL2, and the hermetic layer HM2 are formed on the interlayer dielectric layer ILD1 and the self-aligned etching stop layer ESL1' to form the etching stop bi-layer structure ESBS1'.

Figure 30E:
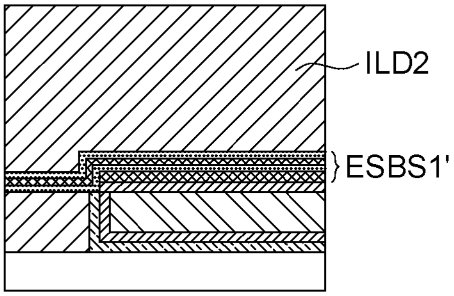

Then, as shown in the FIG. 30E, the interlayer dielectric layer ILD2 is formed on the etching stop bi-layer structure ESBS1'.

Figure 30F:
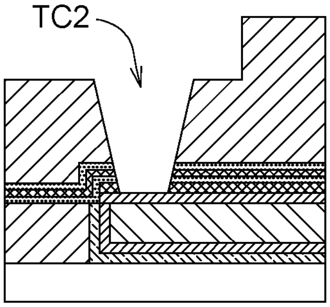

Next, as shown in the FIG. 30F, the trench TC2 is formed in the interlayer dielectric layer ILD2.

Figure 30G:
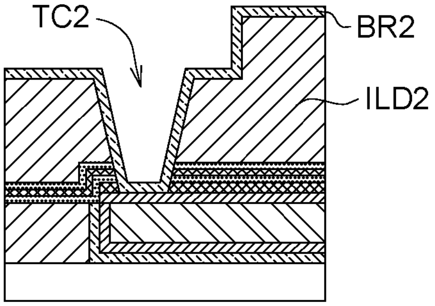

Afterwards, as shown in the FIG. 30G, the barrier layer BR2 is formed on the interlayer dielectric layer ILD2, the bottom surface of the trench TC2 and the later-wall of the trench TC2.

Figure 30H:
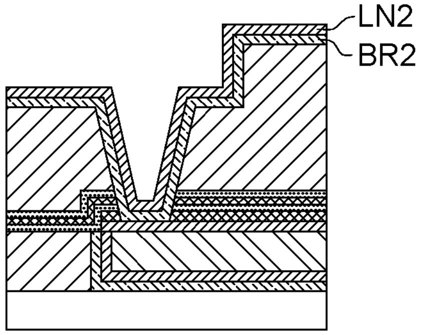

Then, as shown in the FIG. 30H, the liner layer LN2 is formed on the barrier layer BR2.

Figure 30I:
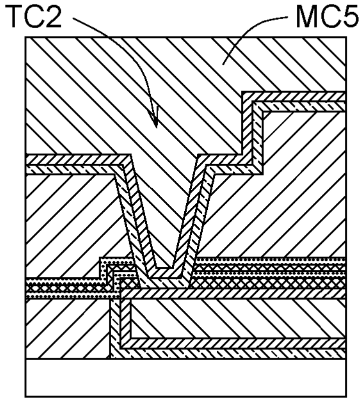

Next, as shown in the FIG. 30I, the metal contact MC5 is filled in the trench TC2.

Figure 30J:
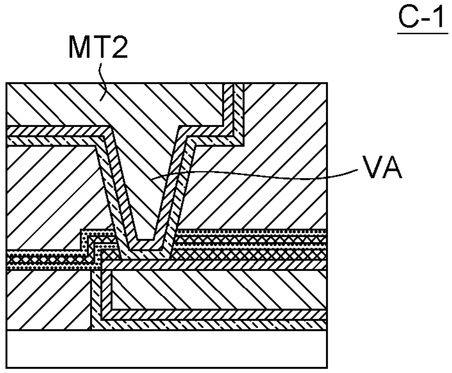

Then, as shown in the FIG. 30J, planarization is performed to form the via VA and the metal layer MT2. As such, the semiconductor structure C-1 is formed through the FIGS. 30A to 30J.

In the embodiment shown in the FIGS. 30A to 30J, the self-aligned etching stop layer ESL1' is self-formed on the metal capping layer CP1' without any selective deposition process. Therefore, the self-aligned etching stop layer ESL1' is only disposed on the metal capping layer CP1'. The parasitic capacitance of the interconnection can be effectively decreased due to the reduction of the high-k material used for the self-aligned etching stop layer ESL1'.

Please refer to FIGS. 31A to 31F, which illustrate a manufacturing method of the semiconductor structure C-2. As shown in the FIG. 31A, the trench TC2 is formed in the interlayer dielectric layer ILD2.

Figure 31A:
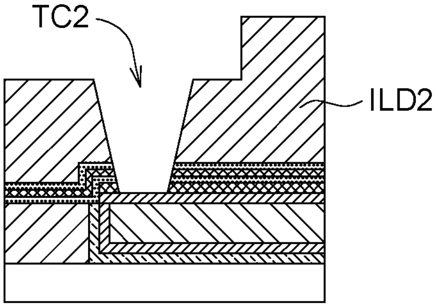
FIGS. 31A to 31F illustrate a manufacturing method of the semiconductor structure C-2.
Figure 31B:
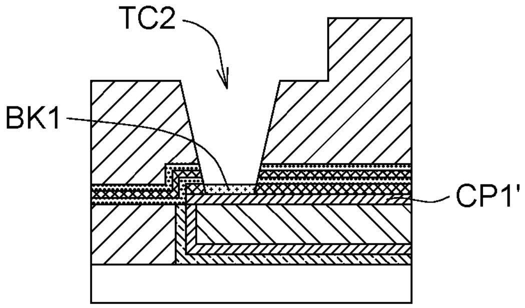

Afterwards, as shown in the FIG. 31B, the blocking layer BK1 is formed on the metal capping layer CP1' and located at the bottom surface of the trench TC2.

Figure 31C:
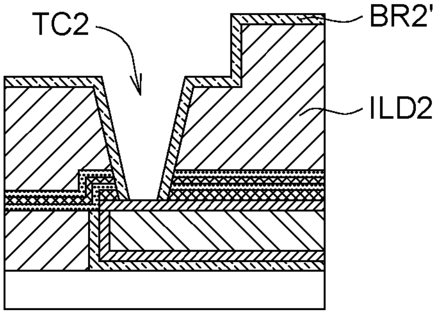

Then, as shown in the FIG. 31C, the barrier layer BR2' is formed on the interlayer dielectric layer ILD2, the bottom surface of the trench TC2 and the later-wall of the trench TC2.

Figure 31D:
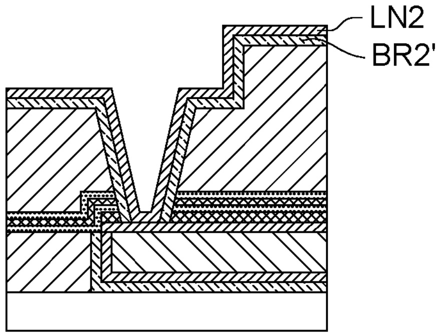

Afterwards, as shown in the FIG. 31D, the liner layer LN2 is formed on the barrier layer BR2'.

Figure 31E:
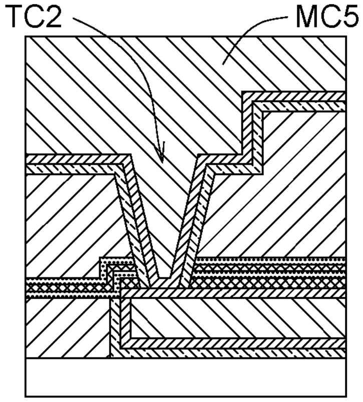

Next, as shown in the FIG. 31E, the metal contact MC5 is filled in the trench TC2.

Figure 31F:
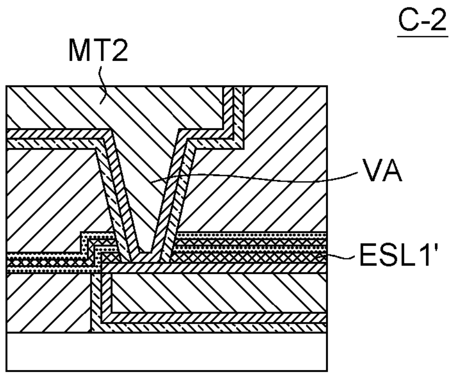

Then, as shown in the FIG. 31F, planarization is performed to form the via VA and the metal layer MT2. As such, the semiconductor structure C-2 is formed through the FIGS. 31A to 31F.

In the embodiment shown in the FIGS. 31A to 31G, the self-aligned etching stop layer ESL1' is self-formed on the metal capping layer CP1' without any selective deposition process. Therefore, the self-aligned etching stop layer ESL1' is only disposed on the metal capping layer CP1'. The parasitic capacitance of the interconnection can be effectively decreased due to the reduction of the high-k material used for the self-aligned etching stop layer ESL1'.

Please refer to FIGS. 32A to 32G, which illustrate a manufacturing method of the semiconductor structure C-3. As shown in the FIG. 32A, the trench TC2 is formed in the interlayer dielectric layer ILD2.

Figure 32A:
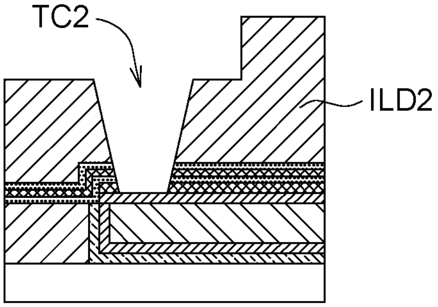
FIGS. 32A to 32G illustrate a manufacturing method of the semiconductor structure C-3.
Figure 32B:
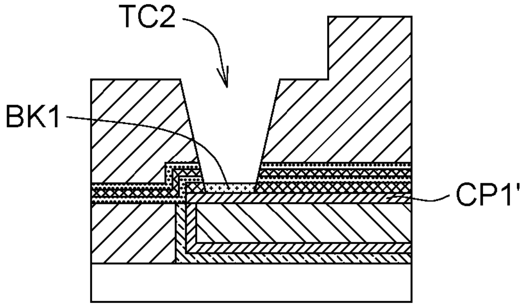

Afterwards, as shown in the FIG. 32B, the blocking layer BK1 is formed on the metal capping layer CP1' and located at the bottom surface of the trench TC2.

Figure 32C:
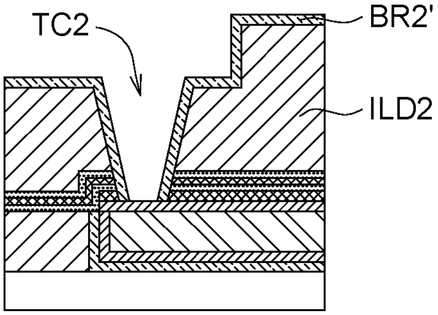

Then, as shown in the FIG. 32C, the barrier layer BR2' is formed on the interlayer dielectric layer ILD2, the bottom surface of the trench TC2 and the later-wall of the trench TC2, and then the blocking layer BK2 is removed.

Figure 32D:
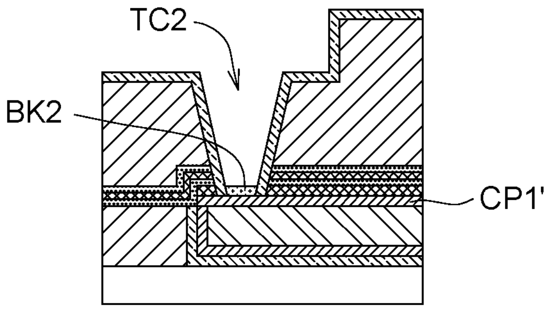

Afterwards, as shown in the FIG. 32D, the blocking layer BK2 is formed on the metal capping layer CP1' and located at the bottom surface of the trench TC2.

Figure 32E:
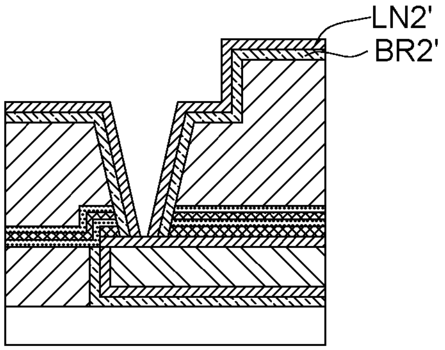

Then, as shown in the FIG. 32E, the liner layer LN2' is formed on the barrier layer BR2' and then the blocking layer BK2 is removed.

Figure 32F:
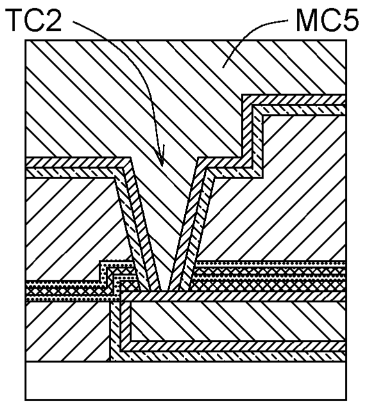

Next, as shown in the FIG. 32F, the metal contact MC5 is filled in the trench TC2.

Figure 32G:
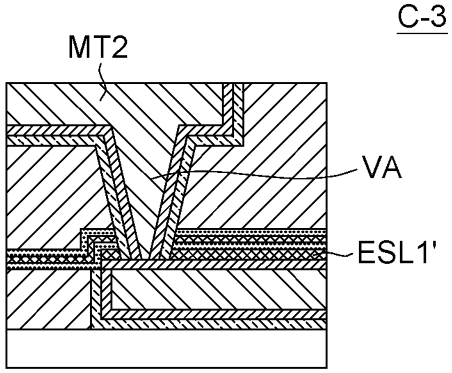

Then, as shown in the FIG. 32G, planarization is performed to form the via VA and the metal layer MT2. As such, the semiconductor structure C-3 is formed through the FIGS. 32A to 32G.

In the embodiment shown in the FIGS. 32A to 32G, the self-aligned etching stop layer ESL1' is self-formed on the metal capping layer CP1' without any selective deposition process. Therefore, the self-aligned etching stop layer ESL1' is only disposed on the metal capping layer CP1'. The parasitic capacitance of the interconnection can be effectively decreased due to the reduction of the high-k material used for the self-aligned etching stop layer ESL1'.

Figure 33A:
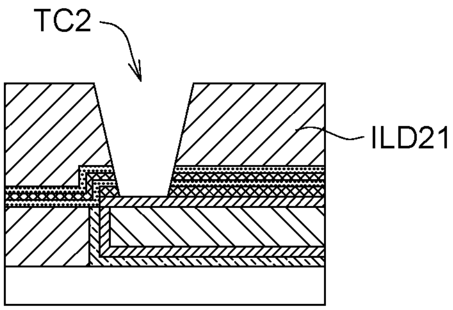
FIGS. 33A to 33P illustrate a manufacturing method of the semiconductor structure D-1.
Figure 33B:
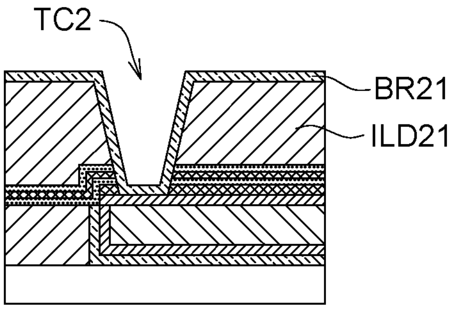
Figure 33C:
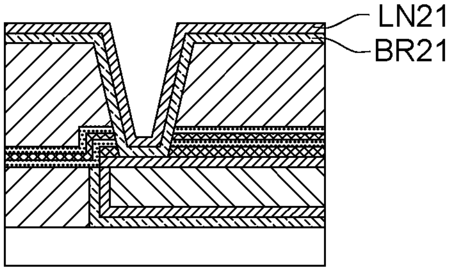
Figure 33D:
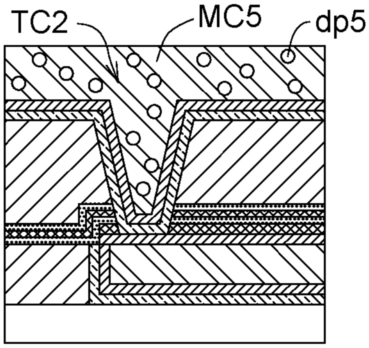
Figure 33E:
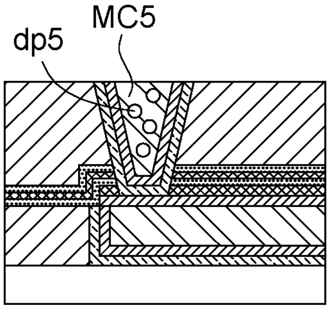
Figure 33F:
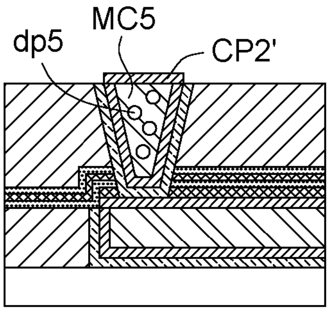
Figure 33G:
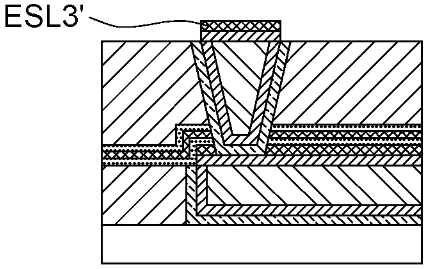
Figure 33H:
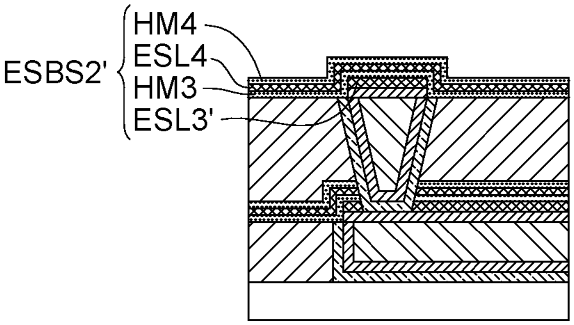
Figure 33I:
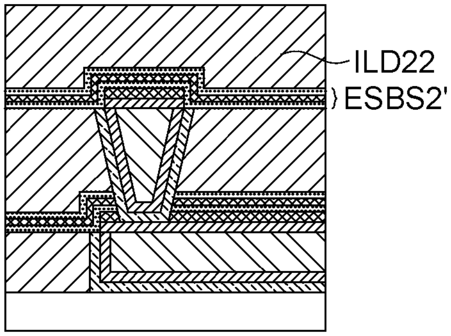
Figure 33J:
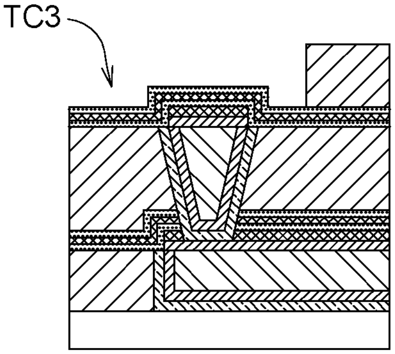
Figure 33K:
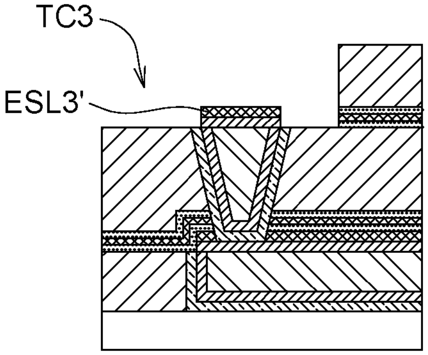
Figure 33L:
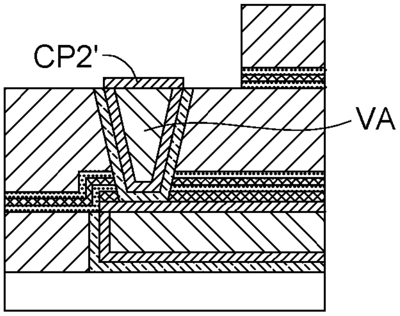
Figure 33M:
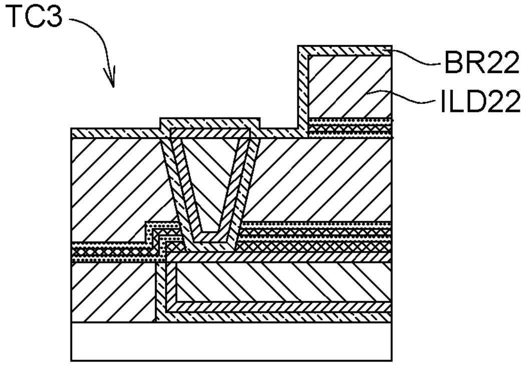
Figure 33N:
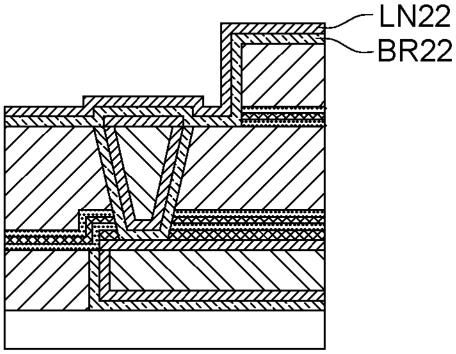
Figure 33O:
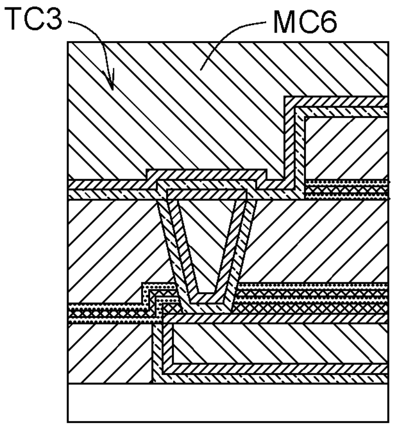
Figure 33P:
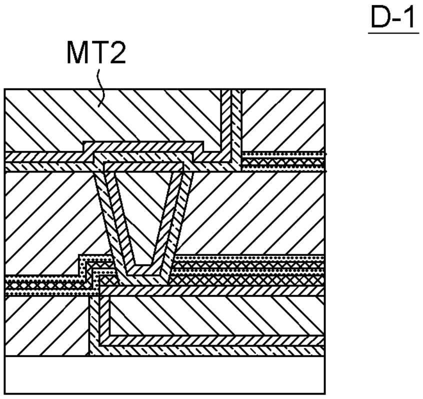

Please refer to FIGS. 33A to 33P, which illustrate a manufacturing method of the semiconductor structure D-1. As shown in the FIG. 33A, the trench TC2 is formed in the interlayer dielectric layer ILD21.

Afterwards, as shown in the FIG. 33B, the barrier layer BR21 is formed on the interlayer dielectric layer ILD21, the bottom surface of the trench TC2 and the later-wall of the trench TC2.

Next, as shown in the FIG. 33C, the liner layer LN2 is formed on the barrier layer BR2.

Afterwards, as shown in the FIG. 33D, the metal contact MC5 with metal dopants dp5 is filled in the trench TC2. In this step, a process temperature is 10° C. to 400° C.

Then, as shown in the FIG. 33E, planarization is performed on the metal contact MC5 with the metal dopants dp5.

Next, as shown in the FIG. 33F, the metal capping layer CP2' is formed on the metal contact MC5 with the dopants dp5.

Then, as shown in the FIG. 33G, a thermal treatment, a photo treatment or a bias-assist treatment is performed on the metal conductor MC5 with the metal dopants dp5 to form the self-aligned etching stop layer ESL3' and the via VA. The self-aligned etching stop layer ESL3' is formed on the metal capping layer CP2'. In this step, the thermal treatment is performed by a hotplate, the photo treatment is performed by a laser, and the bias-assist treatment is performed by applying a voltage. After the thermal treatment, the photo treatment or the bias-assist treatment, the dopants dp5 will be gathered at the top of the metal capping layer CP2' to form the via VA and the self-aligned etching stop layer ESL3'. In this step, a process temperature is 10° C. to 400° C. The process temperature in the step shown in the FIG. 33G is lower than the process temperature in the step shown in the FIG. 33D.

Afterwards, as shown in the FIG. 33H, the hermetic layer HM3, the conformal etching stop layer ESL4, and the hermetic layer HM4 are formed on the interlayer dielectric layer ILD21 and the self-aligned etching stop layer ESL3' to form the etching stop bi-layer structure ESBS2'.

Then, as shown in the FIG. 33I, the interlayer dielectric layer ILD22 is formed on the etching stop bi-layer structure ESBS2'.

Next, as shown in the FIG. 33J to FIG. 33K, the trench TC3 is formed in the interlayer dielectric layer ILD22. The etching is stopped at the self-aligned etching stop layer ESL3'.

Afterwards, as shown in the FIG. 33L, the self-aligned etching stop layer ESL3' is removed and the metal capping layer CP2' is formed on the via VA.

Next, as shown in the FIG. 33M, the barrier layer BR22 is formed on the interlayer dielectric layer ILD22, the bottom surface of the trench TC3 and the later-wall of the trench TC3.

Then, as shown in the FIG. 33N, the liner layer LN22 is formed on the barrier layer BR22.

Next, as shown in the FIG. 33O, the metal contact MC6 is filled in the trench TC3.

Then, as shown in the FIG. 33P, planarization is performed to form the metal layer MT2. As such, the semiconductor structure D-1 is formed through the FIGS. 33A to 33P.

In the embodiment shown in the FIGS. 33A to 33P, the self-aligned etching stop layer ESL1' is self-formed on the metal capping layer CP1' without any selective deposition process, so the self-aligned etching stop layer ESL1' is only disposed on the metal capping layer CP1'. The self-aligned etching stop layer ESL3' (shown in FIG. 33G) formed on the via VA only is removed, so the there is no self-aligned etching stop layer ESL3' (shown in FIG. 33G) in the semiconductor structure D-1. The parasitic capacitance of the interconnection can be effectively decreased due to the reduction of the high-k material used for the self-aligned etching stop layer ESL1' or the self-aligned etching stop layer ESL3' (shown in FIG. 33G).

Please refer to FIGS. 34A to 34K, which illustrate a manufacturing method of the semiconductor structure D-3. As shown in the FIG. 34A, the trench TC2 is formed in the interlayer dielectric layer ILD21.

Figure 34A:
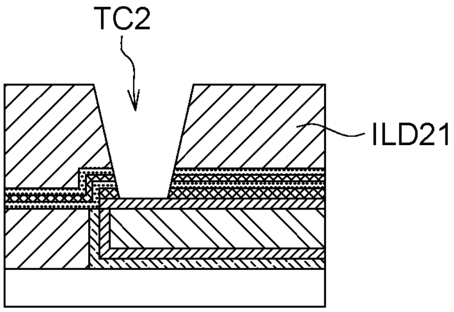
FIGS. 34A to 34K illustrate a manufacturing method of the semiconductor structure D-3.
Figure 34B:
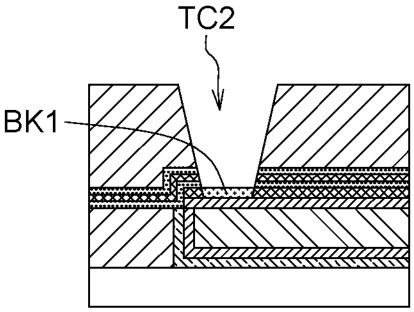

Afterwards, as shown in the FIG. 34B, the blocking layer BK1 is formed on the metal capping layer CP1' and located at the bottom surface of the trench TC2.

Figure 34C:
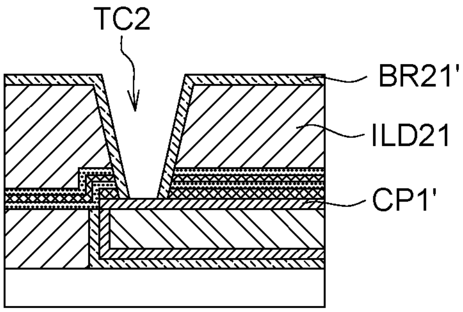

Then, as shown in the FIG. 34C, the barrier layer BR21' is formed on the interlayer dielectric layer ILD21 and the later-wall of the trench TC2, and then the blocking layer BK1 is removed.

Figure 34D:
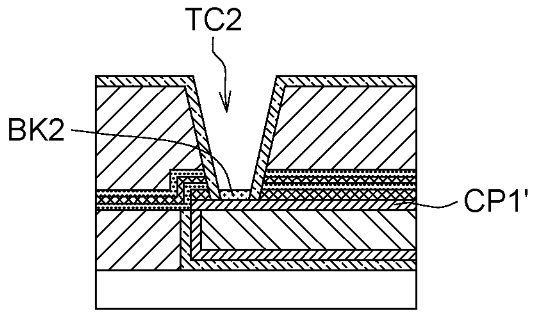

Next, as shown in the FIG. 34D, the blocking layer BK2 is formed on the metal capping layer CP1' and located at the bottom surface of the trench TC2.

Figure 34E:
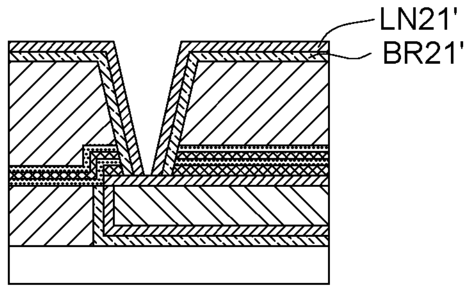

Then, as shown in the FIG. 34E, the liner layer LN2' is formed on the barrier layer BR2'.

Figure 34F:
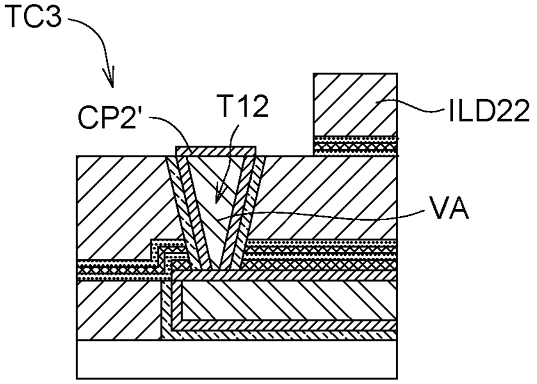

Afterwards, as shown in the FIG. 34F, the via is formed in the trench TC2, the interlayer dielectric layer ILD22, the trench TC3 is formed in the interlayer dielectric layer ILD22, and the metal capping layer CP2' is formed on the via VA.

Figure 34G:
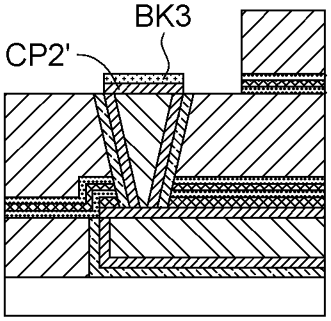

Then, as shown in the FIG. 34G, the blocking layer BK3 is formed on the metal capping layer CP2'.

Figure 34H:
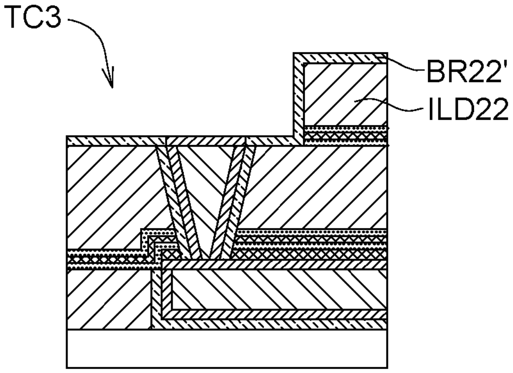

Next, as shown in the FIG. 34H, the barrier layer BR22' is formed on the interlayer dielectric layer ILD22, the bottom surface of the trench TC3 and the later-wall of the trench TC3, and then the blocking layer BK3 is removed.

Figure 34I:
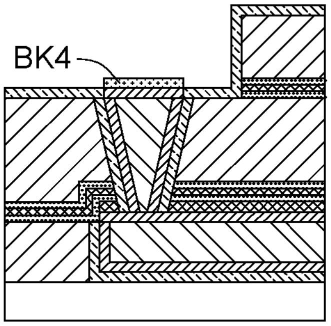

Afterwards, as shown in the FIG. 34I, the blocking layer BK4 is formed on the metal capping layer CP2'.

Figure 34J:
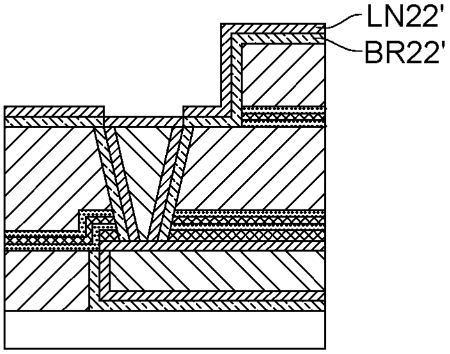

Then, as shown in the FIG. 34J, the liner layer LN22' is formed on the barrier layer BR22', and then the blocking layer BK4 is removed.

Figure 34K:
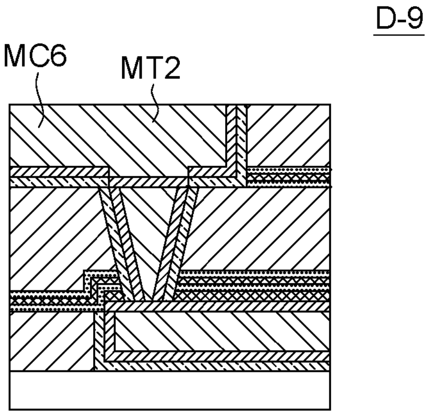

Afterwards, as shown in the FIG. 34K, the metal conductor MC6 is filled in the trench TC3 to form the metal layer MT2. As such, the semiconductor structure D-3 is formed through the FIGS. 34A to 34K.

In the embodiment shown in the FIGS. 34A to 34K, the self-aligned etching stop layer ESL1' is self-formed on the metal capping layer CP1' without any selective deposition process, so the self-aligned etching stop layer ESL1' is only disposed on the metal capping layer CP1'. The self-aligned etching stop layer ESL3' formed on the via VA only is removed, so the there is no self-aligned etching stop layer ESL3' in the semiconductor structure D-1. The parasitic capacitance of the interconnection can be effectively decreased due to the reduction of the high-k material used for the self-aligned etching stop layer ESL1' or the self-aligned etching stop layer ESL3'.

According to the disclosure described above, several embodiments are shown as below.

Example Embodiment 1: A manufacturing method of a semiconductor structure is provided. The manufacturing method includes the following steps. A trench is formed in a first interlayer dielectric (ILD) layer. A metal conductor with metal dopants is filled in the trench. Planarization is performed on the metal conductor with the metal dopants. A thermal treatment, a photo treatment or a bias-assist treatment is performed on the metal conductor with the metal dopants to form a self-forming metal capping layer on a first metal layer. An etching stop bi-layer structure is formed on the first interlayer dielectric layer and the self-forming metal capping layer. A via, a second interlayer dielectric (ILD) layer and a second metal layer are formed on the etching stop bi-layer structure. The via is embedded in the second interlayer dielectric layer and the via is disposed between the first metal layer and the second metal layer.

Example Embodiment 2 based on the Example Embodiment 1: A material of the metal dopants is Vanadium (V), Niobium (Nb), Molybdenum (Mo), Tungsten (W) or Manganese (Mn).

Example Embodiment 3 based on the Example Embodiment 1: In the step of filling the metal conductor with the metal dopants in the trench, the metal conductor with the metal dopants is filled by Chemical Vapor Deposition (CVD), Atomic Layer Deposition (ALD), Physical Vapor Deposition (PVD), Electro Chemical Plating (ECP) or Electroless plating.

Example Embodiment 4 based on the Example Embodiment 1: In the step of filling the metal conductor with the metal dopants in the trench, a process temperature is 10° C. to 400° C.

Example Embodiment 5 based on the Example Embodiment 1: The thermal treatment is performed by a hotplate, the photo treatment is performed by a laser, and the bias-assist treatment is performed by applying a voltage.

Example Embodiment 6 based on the Example Embodiment 1: In the step of performing the thermal treatment, the photo treatment or the bias-assist treatment on the metal conductor with the metal dopants to form the self-forming metal capping layer on the first metal layer, a process temperature is 10° C. to 400° C.

Example Embodiment 7 based on the Example Embodiment 1: A process temperature in the step of filling the metal conductor with the metal dopants in the trench is lower than a process temperature in the step of performing the thermal treatment, the photo treatment or the bias-assist treatment on the metal conductor with the metal dopants to form the self-forming metal capping layer on the first metal layer.

Example Embodiment 8 based on the Example Embodiment 1: A thickness of the self-forming metal capping layer is 1 Å to 100 μm.

Example Embodiment 9: A manufacturing method of a semiconductor structure is provided. The manufacturing method of the semiconductor structure include the following steps. A trench is formed in a first interlayer dielectric (ILD) layer. A metal conductor with metal dopants is filled in the trench. Planarization is performed on the metal conductor with the metal dopants. A metal capping layer is formed on the metal conductor with the metal dopants. A thermal treatment, a photo treatment or a bias-assist treatment is performed on the metal conductor with the metal dopants to form a self-aligned etching stop layer and a first metal layer. The self-aligned etching stop layer is formed on the metal capping layer. A conformal etching stop layer is formed on the first interlayer dielectric layer and the self-aligned etching stop layer to form an etching stop bi-layer structure. A via, a second interlayer dielectric (ILD) layer and a second metal layer are formed. The via is embedded in the second interlayer dielectric layer and the via is disposed between the first metal layer and the second metal layer.

Example Embodiment 10 based on the Example Embodiment 9: A material of the metal dopants is Zirconium (Zr) or Aluminum (Al).

Example Embodiment 11 based on the Example Embodiment 9: In the step of filling the metal conductor with the metal dopants in the trench, the metal conductor with the metal dopants is filled by Chemical Vapor Deposition (CVD), Atomic Layer Deposition (ALD), Physical Vapor Deposition (PVD), Electro Chemical Plating (ECP) or Electroless plating.

Example Embodiment 12 based on the Example Embodiment 9: In the step of filling the metal conductor with the metal dopants in the trench, a process temperature is 10° C. to 400° C.

Example Embodiment 13 based on the Example Embodiment 9: The thermal treatment is performed by a hotplate, the photo treatment is performed by a laser, and the bias-assist treatment is performed by applying a voltage.

Example Embodiment 14 based on the Example Embodiment 9: A thickness of the self-aligned etching stop layer is 1 Å to 100 μm.

Example Embodiment 15 based on the Example Embodiment 9: In the step of performing the thermal treatment, the photo treatment or the bias-assist treatment on the metal conductor with the metal dopants to form the self-aligned etching stop layer and the first metal layer, a process temperature is 10° C. to 400° C.

Example Embodiment 16: A semiconductor structure is provided. The semiconductor structure includes a first interlayer dielectric (ILD) layer, a first metal layer, a metal capping layer, an etching stop bi-layer structure, a second interlayer dielectric layer, a via and a second metal layer. The first metal layer is embedded in the first interlayer dielectric layer. The metal capping layer is disposed on the first metal layer. The etching stop bi-layer structure includes a self-aligned etching stop layer and a conformal etching stop layer. The self-aligned etching stop layer is disposed on the metal capping layer. The conformal etching stop layer is disposed on the first interlayer dielectric layer and the self-aligned etching stop layer. The second interlayer dielectric (ILD) layer is disposed on the etching stop bi-layer structure. The via is embedded in the second interlayer dielectric layer. The second metal layer is embedded in the second interlayer dielectric layer and disposed on the via.

Example Embodiment 17 based on the Example Embodiment 16: A material of the self-aligned etching stop layer is Zirconium oxide (ZrO2) or Aluminum oxide.

Example Embodiment 18 based on the Example Embodiment 16: A thickness of the self-aligned etching stop layer is 1 Å to 100 μm.

Example Embodiment 19 based on the Example Embodiment 16: The self-aligned etching stop layer only covers the metal capping layer.

Example Embodiment 20 based on the Example Embodiment 16: The etching stop bi-layer structure further includes a first hermetic layer and a second hermetic layer. The first hermetic layer is disposed between the first interlayer dielectric layer and the conformal etching stop layer, and disposed between the self-aligned etching stop layer and the conformal etching stop layer. The second hermetic layer is disposed on the conformal etching stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor structure, comprising:

forming a trench in a first interlayer dielectric (ILD) layer;

filling a metal conductor with metal dopants in the trench;

performing planarization on the metal conductor with the metal dopants;

performing a thermal treatment, a photo treatment or a bias-assist treatment on the metal conductor with the metal dopants to form a self-forming metal capping layer on a first metal layer;

forming an etching stop bi-layer structure covering and contacting the first interlayer dielectric layer and the self-forming metal capping layer;

forming a via, a second interlayer dielectric (ILD) layer and a second metal layer on the etching stop bi-layer structure, wherein the via is embedded in the second interlayer dielectric layer and the via is disposed between the first metal layer and the second metal layer.

2. The manufacturing method of the semiconductor structure according to claim 1, wherein a material of the metal dopants is Vanadium (V), Niobium (Nb), Molybdenum (Mo), Tungsten (W) or Manganese (Mn).

3. The manufacturing method of the semiconductor structure according to claim 1, wherein in the filling the metal conductor with the metal dopants in the trench, the metal conductor with the metal dopants is filled by Chemical Vapor Deposition (CVD), Atomic Layer Deposition (ALD), Physical Vapor Deposition (PVD), Electro Chemical Plating (ECP) or Electroless plating.

4. The manufacturing method of the semiconductor structure according to claim 1, wherein in the filling the metal conductor with the metal dopants in the trench, a process temperature is 10° C. to 400° C.

5. The manufacturing method of the semiconductor structure according to claim 1, wherein the thermal treatment is performed by a hotplate, the photo treatment is performed by a laser, and the bias-assist treatment is performed by applying a voltage.

6. The manufacturing method of the semiconductor structure according to claim 1, wherein in the performing the thermal treatment, the photo treatment or the bias-assist treatment on the metal conductor with the metal dopants to form the self-forming metal capping layer on the first metal layer, a process temperature is 10° C. to 400° C.

7. The manufacturing method of the semiconductor structure according to claim 1, wherein a process temperature in the filling the metal conductor with the metal dopants in the trench is lower than a process temperature in the performing the thermal treatment, the photo treatment or the bias-assist treatment on the metal conductor with the metal dopants to form the self-forming metal capping layer on the first metal layer.

8. The manufacturing method of the semiconductor structure according to claim 1, wherein a thickness of the self-forming metal capping layer is 1 Å to 100 um.

9. A manufacturing method of a semiconductor structure, comprising:

forming a trench in a first interlayer dielectric (ILD) layer;

filling a metal conductor with metal dopants in the trench;

performing planarization on the metal conductor with the metal dopants;

forming a metal capping layer on the metal conductor with the metal dopants;

performing a thermal treatment, a photo treatment or a bias-assist treatment on the metal conductor with the metal dopants to form a self-aligned etching stop layer and a first metal layer, wherein the self-aligned etching stop layer is formed on the metal capping layer;

forming a conformal etching stop layer on the first interlayer dielectric layer and the self-aligned etching stop layer to form an etching stop bi-layer structure; and forming a via, a second interlayer dielectric (ILD) layer and a second metal layer, wherein the via is embedded in the second interlayer dielectric layer and the via is disposed between the first metal layer and the second metal layer.

10. The manufacturing method of the semiconductor structure according to claim 9, wherein a material of the metal dopants is Zirconium (Zr) or Aluminum (Al).

11. The manufacturing method of the semiconductor structure according to claim 9, wherein in the filling the metal conductor with the metal dopants in the trench, the metal conductor with the metal dopants is filled by Chemical Vapor Deposition (CVD), Atomic Layer Deposition (ALD), Physical Vapor Deposition (PVD), Electro Chemical Plating (ECP) or Electroless plating.

12. The manufacturing method of the semiconductor structure according to claim 9, wherein in the filling the metal conductor with the metal dopants in the trench, a process temperature is 10° C. to 400° C.

13. The manufacturing method of the semiconductor structure according to claim 9, wherein the thermal treatment is performed by a hotplate, the photo treatment is performed by a laser, and the bias-assist treatment is performed by applying a voltage.

14. The manufacturing method of the semiconductor structure according to claim 9, wherein a thickness of the self-aligned etching stop layer is 1 Å to 100 μm.

15. The manufacturing method of the semiconductor structure according to claim 9, wherein in the performing the thermal treatment, the photo treatment or the bias-assist treatment on the metal conductor with the metal dopants to form the self-aligned etching stop layer and the first metal layer, a process temperature is 10° C. to 400° C.

16. A semiconductor structure, comprising:

a first interlayer dielectric (ILD) layer;

a first metal layer, embedded in the first interlayer dielectric layer;

a metal capping layer, disposed on the first metal layer;

an etching stop bi-layer structure, including:

a self-aligned etching stop layer, disposed on the metal capping layer;

a first hermetic layer, disposed on the self-aligned etching stop layer; and a conformal etching stop layer, disposed on the first interlayer dielectric layer and the self-aligned etching stop layer, wherein the metal capping layer, the self-aligned etching stop layer, the first hermetic layer and the conformal etching stop layer are stacked in sequence;

a second interlayer dielectric (ILD) layer, disposed on the etching stop bi-layer structure;

a via, embedded in the second interlayer dielectric layer; and a second metal layer, embedded in the second interlayer dielectric layer and disposed on the via.

17. The semiconductor structure according to claim 16, wherein a material of the self-aligned etching stop layer is Zirconium oxide (ZrO2) or Aluminum oxide.

18. The semiconductor structure according to claim 16, wherein the self-aligned etching stop layer is different from the metal capping layer.

19. The semiconductor structure according to claim 16, wherein the self-aligned etching stop layer only covers the metal capping layer.

20. The semiconductor structure according to claim 16, wherein the etching stop bi-layer structure further includes:

a second hermetic layer, disposed on the conformal etching stop layer.

* * * * *